United States Patent
Kohno et al.

(10) Patent No.: US 8,138,103 B2
(45) Date of Patent: Mar. 20, 2012

(54) PLASMA CVD METHOD, METHOD FOR FORMING SILICON NITRIDE FILM AND METHOD FOR MANUFACTURING SEMICONDUCTOR DEVICE

(75) Inventors: Masayuki Kohno, Amagasaki (JP); Tatsuo Nishita, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 45 days.

(21) Appl. No.: 12/302,861

(22) PCT Filed: May 30, 2007

(86) PCT No.: PCT/JP2007/060974
§ 371 (c)(1),
(2), (4) Date: Nov. 28, 2008

(87) PCT Pub. No.: WO2007/139140
PCT Pub. Date: Dec. 6, 2007

(65) Prior Publication Data
US 2009/0197376 A1    Aug. 6, 2009

(30) Foreign Application Priority Data
May 31, 2006   (JP) .................. 2006-152433

(51) Int. Cl.
*H01L 21/31* (2006.01)
*H01L 21/469* (2006.01)
*H01L 21/318* (2006.01)
*C23C 8/54* (2006.01)

(52) U.S. Cl. ............... 438/783; 438/791; 257/E21.293; 427/590

(58) Field of Classification Search .................. 438/197, 438/778, 783–784, 791–792; 427/569–570, 427/574–575, 579, 585, 587–588, 590, 595
See application file for complete search history.

(56) References Cited

U.S. PATENT DOCUMENTS

| | | | | |
|---|---|---|---|---|
| 4,668,365 A | * | 5/1987 | Foster et al. | 204/192.23 |
| 6,380,558 B1 | * | 4/2002 | Yamazaki et al. | 257/57 |
| 2002/0081794 A1 | | 6/2002 | Ito | |
| 2003/0178144 A1 | * | 9/2003 | Ohmi et al. | 156/345.41 |

(Continued)

FOREIGN PATENT DOCUMENTS

JP        60 117737        6/1985

(Continued)

OTHER PUBLICATIONS

Office Action issued Jul. 5, 2010, in China Patent Application No. 200780019791.0 (with English translation).

(Continued)

*Primary Examiner* — Charles Garber
*Assistant Examiner* — Calvin Choi
(74) *Attorney, Agent, or Firm* — Oblon, Spivak, McClelland, Maier & Neustadt, L.L.P.

(57) ABSTRACT

A plasma processing apparatus generates plasma by introducing microwaves into a processing chamber by using a planar antenna having a plurality of slots. By using the plasma processing apparatus, a nitrogen containing gas and a silicon containing gas introduced into the processing chamber are brought into the plasma state, and at the time of depositing by using the plasma a silicon nitride film on the surface of the a substrate to be processed, stress to the silicon nitride film to be formed is controlled by the combination of the type and the processing pressure of the nitrogen containing gas.

14 Claims, 15 Drawing Sheets

U.S. PATENT DOCUMENTS

| | | |
|---|---|---|
| 2004/0238104 A1 | 12/2004 | Suzuki et al. |
| 2006/0162661 A1* | 7/2006 | Jung et al. ............... 118/723 ER |
| 2006/0199357 A1* | 9/2006 | Wan et al. ..................... 438/482 |
| 2006/0234434 A1* | 10/2006 | Filipiak ........................ 438/197 |
| 2006/0264063 A1* | 11/2006 | Stern et al. ................... 438/776 |
| 2007/0105299 A1* | 5/2007 | Fang et al. ................... 438/199 |
| 2007/0181951 A1* | 8/2007 | Chen et al. ................... 257/374 |

FOREIGN PATENT DOCUMENTS

| | | |
|---|---|---|
| JP | 63 243277 | 10/1988 |
| JP | 3 146666 | 6/1991 |
| JP | 4 358077 | 12/1992 |
| JP | 5 62971 | 3/1993 |
| JP | 6 101051 | 4/1994 |
| JP | 2002 198368 | 7/2002 |
| JP | 2004 335127 | 11/2004 |
| JP | 2005-93737 | 4/2005 |
| JP | 2005 222778 | 8/2005 |
| JP | 2006-80161 | 3/2006 |
| JP | 2006-120922 | 5/2006 |
| JP | 2006 120992 | 5/2006 |
| KR | 2000-0050308 | 8/2000 |

OTHER PUBLICATIONS

Office Action issued Jun. 9, 2011 in Korea Application No. 10-2011-7008827 (With English Translation).

Korean Office Action issued Feb. 17, 2011, in Patent Application No. 10-2008-7029306 (with English-language translation).

Korean Decision of Rejection issued in Korean Patent Application No. 10-2008-7029306 mailed Oct. 25, 2011. (with English translation).

* cited by examiner

PLASMA CVD

PLASMA CVD METHOD, METHOD FOR FORMING SILICON NITRIDE FILM AND METHOD FOR MANUFACTURING SEMICONDUCTOR DEVICE

FIELD OF THE INVENTION

The present invention relates to a plasma chemical vapor deposition (CVD) method, a method for forming a silicon nitride film using the same, and a method for manufacturing a semiconductor device using the same.

BACKGROUND OF THE INVENTION

A silicon nitride film is used as an insulating film, a protection film or the like in various semiconductor devices. The silicon nitride film may be formed by a plasma CVD method using a silicon-containing gas such as silane ($SiH_4$) and a nitrogen-containing gas such as nitrogen or ammonia as source gases (see, e.g., Japanese Laid-open Publication No. 2000-260767).

In the silicon nitride film formed by a conventional plasma CVD method, it is important to suppress stresses, i.e., tensile and compressive stresses, of the film, which have a bad influence on device characteristics. For instance, if a compressive stress of the silicon nitride film is large, stress migration may occur to cause disconnection of metal lines right under the film. Accordingly, the compressive stress needs to be reduced to prevent such disconnection. In the plasma CVD method, the direction of stress (tensile stress or comprehensive stress) of the silicon nitride film or the magnitude of stress depends on process conditions including pressure, temperature, gas species, etc. Thus, conventionally, process conditions are set such that a strong stress is not applied to the silicon nitride film, and a silicon nitride film having no stress is formed by a plasma CVD method (e.g., Maeta Gazuo [VLSI and CVD] Tenshoten, published on Jul. 31, 1997).

Recently, attempts have been made to take advantage of the stress of silicon nitride film to improve the device characteristics. However, for example, a parallel plate type or inductively coupled plasma CVD apparatus utilizes plasma having a relatively high electron temperature. Accordingly, when film formation conditions such as high-frequency output, pressure and temperature are changed to introduce a high stress, plasma damage may occur in the silicon nitride film. Thus, it is difficult to obtain a high-quality silicon nitride film and it is also difficult to obtain a silicon nitride film having a high stress. Further, since there is a limitation in the plasma process conditions, it is also difficult to precisely control a stress.

SUMMARY OF THE INVENTION

It is an object of the present invention to provide a plasma CVD method capable of precisely controlling a stress of a silicon nitride film formed by using a plasma CVD method and also reducing plasma damage.

Further, it is another object of the present invention to provide a method for forming a silicon nitride film having a desired stress by using the plasma CVD method.

Further, it is still another object of the present invention to provide a method for manufacturing a semiconductor device using the silicon nitride film.

In accordance with a first aspect of the present invention, there is provided plasma CVD method comprising: preparing a plasma processing apparatus including a vacuum evacuable processing chamber, a microwave generator for generating microwaves, a planar antenna having slots to introduce the microwaves from the microwave generator into the processing chamber through the slots, and a gas supply system for supplying a source gas for film formation into the processing chamber; loading a substrate to be processed in the processing chamber; and introducing a nitrogen-containing gas and a silicon-containing gas into the processing chamber, converting the gases into plasma with the microwaves, and depositing a silicon nitride film on a surface of the substrate by using the plasma, wherein a stress of the silicon nitride film is controlled by selecting a type of the nitrogen-containing gas and a process pressure.

In the first aspect, when an ammonia gas is used as the nitrogen-containing gas, the silicon nitride film may be formed at a process pressure of 6.7 Pa or more to have a tensile stress of 400 MPa or more. Further, the silicon nitride film may be formed at a process pressure of 40 Pa or more to have a tensile stress of 800 MPa or more. Further, the silicon nitride film may be formed at a process pressure of 133.3 Pa or more to have a tensile stress of 1500 MPa or more.

In the first aspect, when a nitrogen gas is used as the nitrogen-containing gas, the silicon nitride film may be formed at a process pressure less than 5.3 Pa to have a compressive stress of 800 MPa or more. Further, the silicon nitride film may be formed at a process pressure of 4 Pa or less to have a compressive stress of 1000 MPa or more.

In accordance with a second aspect of the present invention, there is provided a method for forming a silicon nitride film, comprising: preparing a plasma processing apparatus including a vacuum evacuable processing chamber, a microwave generator for generating microwaves, a planar antenna having slots to introduce the microwaves from the microwave generator into the processing chamber through the slots, and a gas supply system for supplying a source gas for film formation into the processing chamber; loading a substrate to be processed in the processing chamber; and introducing a nitrogen-containing gas and a silicon-containing gas into the processing chamber, converting the gases into plasma with the microwaves, and depositing a silicon nitride film on a surface of the substrate by using the plasma, wherein an ammonia gas is used as the nitrogen-containing gas and the silicon nitride film is formed at a process pressure of 6.7 Pa or more to have a tensile stress of 400 MPa or more.

In the second aspect, the silicon nitride film may be formed at a process pressure of 40 Pa or more to have a tensile stress of 800 MPa or more, and at a process pressure of 133.3 Pa or more to have a tensile stress of 1500 MPa or more.

In accordance with a third aspect of the present invention, there is provided a method for forming a silicon nitride film, comprising: preparing a plasma processing apparatus including a vacuum evacuable processing chamber, a microwave generator for generating microwaves, a planar antenna having slots to introduce the microwaves from the microwave generator through the slots, and a gas supply system for supplying a source gas for film formation into the processing chamber; loading a substrate to be processed in the processing chamber; and introducing a nitrogen-containing gas and a silicon-containing gas into the processing chamber, converting the gases into plasma with the microwaves, and depositing a silicon nitride film on a surface of the substrate by using the plasma, wherein a nitrogen gas is used as the nitrogen-containing gas and the silicon nitride film is formed at a process pressure less than 5.3 Pa to have a compressive stress of 800 MPa or more.

In the third aspect, the silicon nitride film may be formed at a process pressure of 4 Pa or less to have a compressive stress of 1000 MPa or more.

In the first to the third aspects, the silicon-containing gas may be disilane ($Si_2H_6$). Further, the silicon nitride film may be deposited at a process temperature of 300° C. to 800° C.

In accordance with a fourth aspect of the present invention, there is provided a method for manufacturing a semiconductor device, comprising: preparing a structure having a gate electrode formed on a main surface of a semiconductor substrate through an insulating film, and a source and a drain formed in a main surface region at opposite sides of the gate electrode; and forming a silicon nitride film to cover the gate electrode, the source and the drain, wherein the silicon nitride film is formed by using a method including: preparing a plasma processing apparatus including a vacuum evacuable processing chamber, a microwave generator for generating microwaves, a planar antenna having slots to introduce the microwaves from the microwave generator into the processing chamber through the slots, and a gas supply system for supplying a source gas for film formation into the processing chamber; loading a substrate to be processed into the processing chamber; and introducing a nitrogen-containing gas and a silicon-containing gas into the processing chamber, converting the gases into plasma with the microwaves, and depositing a silicon nitride film on a surface of the substrate by using the plasma, wherein an ammonia gas is used as the nitrogen-containing gas and the silicon nitride film is formed at a process pressure of 6.7 Pa or more to have a tensile stress of 400 MPa or more.

In accordance with a fifth aspect of the present invention, there is provided a method for manufacturing a semiconductor device, comprising: preparing a structure having a gate electrode formed on a main surface of a semiconductor substrate through an insulating film, and a source and a drain formed in a main surface region at opposite sides of the gate electrode; and forming a silicon nitride film to cover the gate electrode, the source and the drain, wherein the silicon nitride film is formed by using a method including: preparing a plasma processing apparatus including a vacuum evacuable processing chamber, a microwave generator for generating microwaves, a planar antenna having slots to introduce the microwaves from the microwave generator into the processing chamber through the slots, and a gas supply system for supplying a source gas for film formation into the processing chamber; loading a substrate to be processed into the processing chamber; and introducing a nitrogen-containing gas and a silicon-containing gas into the processing chamber, converting the gases into plasma with the microwaves, and depositing a silicon nitride film on a surface of the substrate by using the plasma, wherein a nitrogen gas is used as the nitrogen-containing gas and the silicon nitride film is formed at a process pressure less than 5.3 Pa to have a compressive stress of 800 MPa or more.

In accordance with a sixth aspect of the present invention, there is provided a storage medium, which is operated on a computer and stores a program for controlling a plasma processing apparatus including a vacuum evacuable processing chamber, a microwave generator for generating microwaves, a planar antenna having slots to introduce the microwaves from the microwave generator into the processing chamber through the slots, and a gas supply system for supplying a source gas for film formation into the processing chamber, wherein the program controls the plasma processing apparatus to perform a plasma CVD method including: loading a substrate to be processed into the processing chamber; and introducing a nitrogen-containing gas and a silicon-containing gas into the processing chamber, converting the gases into plasma with the microwaves, and depositing a silicon nitride film on a surface of the substrate by using the plasma, wherein a stress of the silicon nitride film is controlled by selecting a type of the nitrogen-containing gas and a process pressure.

In accordance with a seventh aspect of the present invention, there is provided a plasma processing apparatus comprising: a vacuum evacuable processing chamber in which a substrate to be processed is loaded; a microwave generator for generating microwaves; a planar antenna having slots to introduce the microwaves from the microwave generator into the processing chamber through the slots; a gas supply system for supplying a source gas for film formation into the processing chamber; and a controller for controlling the plasma processing apparatus to perform a plasma CVD method including loading a substrate to be processed into the processing chamber, introducing a nitrogen-containing gas and a silicon-containing gas into the processing chamber, converting the gases into plasma with the microwaves, and depositing a silicon nitride film on a surface of the substrate by using the plasma, wherein a stress of the silicon nitride film is controlled by selecting a type of the nitrogen-containing gas and a process pressure.

In accordance with the plasma CVD method of the present invention, a silicon nitride film having a desired stress can be formed by using a plasma process apparatus in which microwaves are introduced into a processing chamber through a planar antenna having slots to generate plasma, and selecting a type of N-containing gas and a process pressure. For instance, when an ammonia gas is used as the N-containing gas and film formation is performed at a process pressure of 6.7 Pa or more, the silicon nitride film may be formed to have a tensile stress of 400 MPa or more. Further, when a nitrogen gas is used as the N-containing gas and film formation is performed at a process pressure less than 5.3 Pa, the silicon nitride film may be formed to have a compressive stress of 800 MPa or more.

The plasma process apparatus, in which microwaves are introduced into the processing chamber through a planar antenna having slots to generate plasma, can perform a process by using plasma having a high density and a low electron temperature. Accordingly, it is possible to surely reduce plasma damage in the plasma CVD. Thus, as the plasma processing apparatus is used, it is possible to extend a selection range of plasma CVD conditions such as a type of N-containing gas and a process pressure and to precisely control the stress of the silicon nitride film.

As described above, since the plasma CVD method of the present invention can not only precisely control the stress of the silicon nitride film, but also suppress plasma damage, it is effective when a silicon nitride film having a stress is formed in the manufacture of various semiconductor devices.

DETAILED DESCRIPTION OF THE EMBODIMENTS

Figure 1:
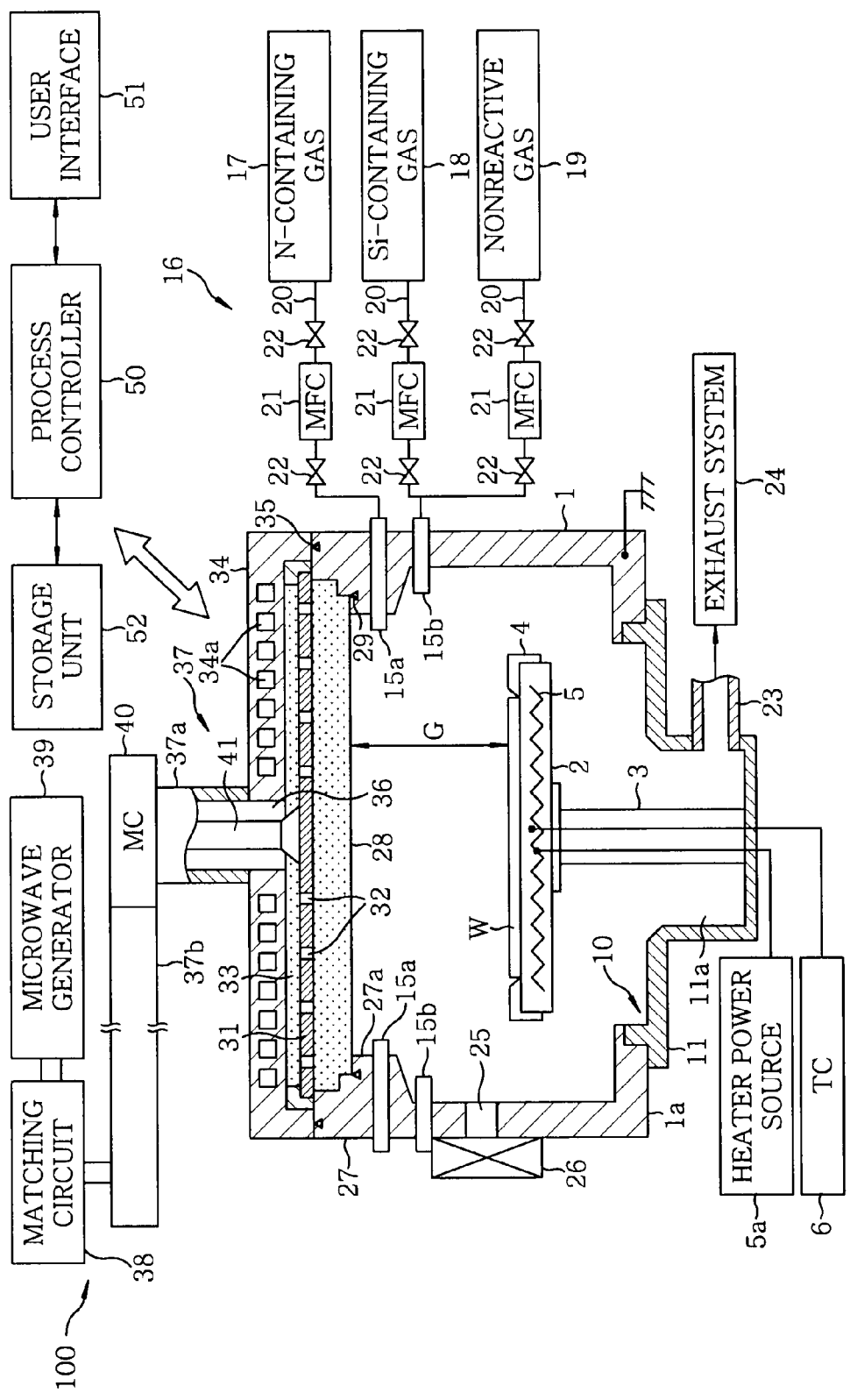
FIG. 1 schematically shows a cross sectional view of an exemplary plasma processing apparatus for performing a method in accordance with the present invention.

Hereinafter, embodiments of the present invention will be described in detail with reference to the accompanying drawings which form a part hereof. FIG. 1 schematically shows a cross sectional view of a plasma processing apparatus for forming a silicon nitride film in accordance with the present invention. The plasma processing apparatus 100 is configured as a radial line slot antenna (RLSA) microwave plasma processing apparatus capable of generating microwave-excited plasma having a high density and a low electron temperature by introducing microwaves into a processing chamber with a planar antenna, particularly, RLSA, having a plurality slots. In the plasma processing apparatus 100, a process can be performed by plasma having a plasma density of $1 \times 10^{10}$ to $5 \times 10^{12}/cm^3$ and a low electron temperature of 0.7 to 2 eV. Thus, the plasma processing apparatus 100 can be usefully used when a silicon nitride film is formed by using a plasma CVD method in a manufacturing process of various semiconductor devices.

The plasma processing apparatus 100 includes an airtightly sealed and approximately cylindrical chamber 1, which is grounded. Alternatively, the chamber 1 may have a polygonal sectional shape as viewed from above. A circular opening 10 is formed at an approximately central portion of a lower wall 1a of the chamber 1. An exhaust chamber 11 communicating with the opening 10 is provided at the lower wall 1a to be protruded downward. The exhaust chamber 11 is connected to an exhaust device 24 through an exhaust pipe 23.

A mounting table 2 made of ceramics, such as AlN, having high thermal conductivity is disposed in the chamber 1 to horizontally support a silicon wafer (hereinafter, simply referred to as a "wafer") W serving as a target substrate. The mounting table 2 is supported by a cylindrical supporting member 3 made of ceramics such as AlN and extending upward from a central bottom portion of the exhaust chamber 11. The mounting table 2 is provided with a cover ring 4 for covering an outer peripheral portion of the mounting table 2 and guiding the wafer W. The cover ring 4 is made of, for example, quartz, AlN, $Al_2O_3$, SiN, etc.

A resistance heater 5 is embedded in the mounting table 2. The heater 5 is supplied with power from a heater power supply 5a to heat the mounting table 2, thereby uniformly heating the wafer W serving as a target substrate. Further, the mounting table 2 is provided with a thermoelectric couple 6 to control a heating temperature of the wafer W within a range from a room temperature to 900° C. Wafer supporting pins (not shown) are provided in the mounting table 2 to be protruded from the surface of the mounting table 2 and retracted into the mounting table, thereby supporting and moving the wafer W up and down.

Annular gas inlets 15a and 15b are provided at upper and lower sides at an upper plate 27 to be described later and a sidewall of the chamber 1, respectively. The gas inlets 15a and 15b are connected to a gas supply system 16 for supplying a source gas and a plasma excitation gas. Each of the gas inlets 15a and 15b may have a nozzle or shower head shape.

The gas supply system 16 includes, for example, a nitrogen-containing gas supply source 17, a silicon-containing gas supply source 18 and a nonreactive gas supply source 19. The nitrogen-containing gas supply source 17 is connected to the gas inlet 15a provided at the upper side, and both the silicon-containing gas supply source 18 and the nonreactive gas supply source 19 are connected to the gas inlet 15b provided at the lower side.

The N-containing gas serving as a source gas for film formation may include nitrogen ($N_2$), ammonia ($NH_3$), or hydrazine derivatives such as monomethyl hydrazine (MMH).

The Si-containing gas serving as another source gas for film formation may include silane ($SiH_4$), preferably, disilane ($Si_2H_6$), or trisilylamine (TSA) [$(SiH_3)_3N$]. Preferably, disilane ($Si_2H_6$) is used as the Si-containing gas.

Further, the nonreactive gas may include, for example, $N_2$ gas or rare gas. The rare gas serving as a plasma excitation gas may include, for example, Ar, Kr, Xe and He gas. In the present invention, the (tensile/compressive) direction of stress of the silicon nitride film can be controlled by selecting the source gas for film formation as will be described later.

The N-containing gas reaches the gas inlet 15a through a gas line 20 and, then, is introduced into the chamber 1 through the gas inlet 15a. Further, the Si-containing gas and the non-reactive gas reach the gas inlet 15b through gas lines 20 and, then, are introduced into the chamber 1 through the gas inlet 15b. Each of the gas lines 20 connected to each of the gas supply sources is provided with a mass flow controller 21 and valves 22 located at the front and rear of the mass flow controller 21 so as to switch the supplied gas or control a flow rate thereof. The rare gas for plasma excitation, for example, Ar, is optional and may not be supplied simultaneously with the source gas for film formation.

The exhaust pipe 23 is connected to the side surface of the exhaust chamber 11. The exhaust pipe 23 is connected to the exhaust device 24 including a high-speed vacuum pump. As the exhaust device 24 is operated, the gas in the chamber 1 uniformly moves to a space 11a of the exhaust chamber 11 along peripheral and lower portions of the mounting table 2 and is discharged through the exhaust pipe 23. Accordingly, the inner pressure of the chamber 1 may reach a predetermined vacuum level of, for example, 0.133 Pa at a high speed.

At the sidewall of the chamber 1, there are provided a loading/unloading port 25 through which the wafer W is delivered between the chamber 1 and a transfer chamber (not shown) adjacent to the plasma processing apparatus 100, and a gate valve 26 for opening and closing the loading/unloading port 25.

The chamber 1 has an upper opening, and the annular upper plate 27 is joined to the upper opening. An annular support portion 27a is formed at an inner peripheral lower portion of the upper plate 27 to be protruded toward a space in the chamber 1. A microwave transmitting plate 28, made of dielectric ceramics such as quartz, $Al_2O_3$ and AlN to transmit microwaves, is airtightly provided on the support portion 27a through a seal member 29. Accordingly, the inside of the chamber 1 is maintained in a sealed state.

A planar antenna member 31 having a circular plate shape is provided on the transmitting plate 28 to face the mounting table 2. The planar antenna member may have a rectangular plate shape without being limited to a circular plate shape. The planar antenna member 31 is fixedly installed at an upper end of the sidewall of the chamber 1. The planar antenna member 31 is formed of a gold or silver plated copper or aluminum plate. The planar antenna member 31 has a plurality of slot-shaped microwave radiation holes 32 formed through the planar antenna member 31 in a predetermined pattern to radiate microwaves.

Figure 2:
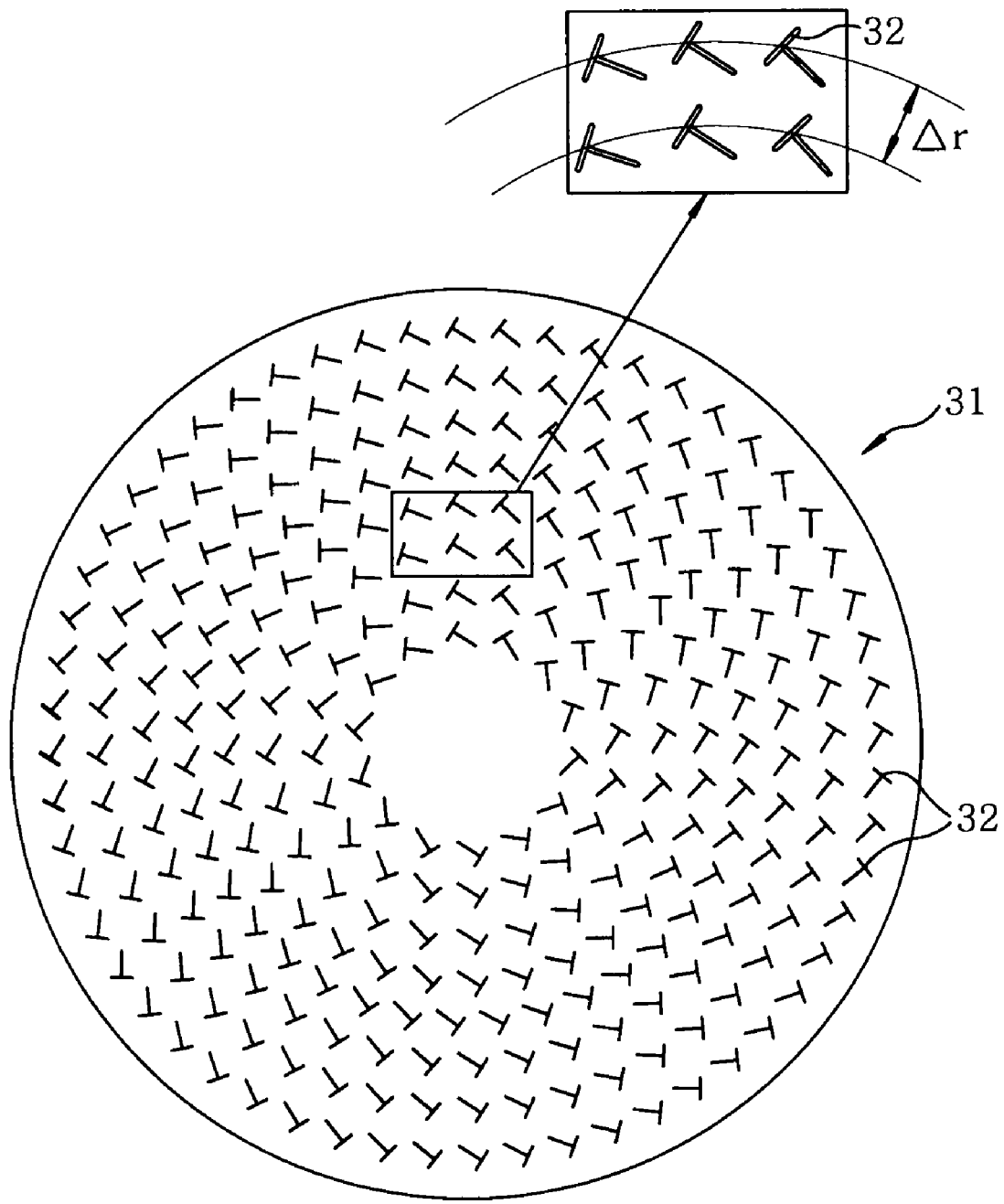
FIG. 2 is a plan view showing a planar antenna member of the plasma processing apparatus of FIG. 1.

As shown in FIG. 2, the microwave radiation holes 32 have pairs of long slots, wherein a pair of the microwave radiation holes 32 are generally arranged in a "T" shape. The microwave radiation holes 32 are arranged in a concentric circular pattern. The length and arrangement interval of the microwave radiation holes 32 depend on the wavelength (λg) of microwaves within a waveguide 37. For example, the microwave radiation holes 32 may be arranged at intervals of λg/4, λg/2 or λg. In FIG. 2, an interval between adjacent microwave radiation holes 32 on different concentric circles is represented by Ar. Also, the microwave radiation holes 32 may have a circular shape or circular arc shape. No particular limitation is imposed on the arrangement of the microwave radiation holes 32. For example, the microwave radiation holes 32 may be arranged in a spiral or radial pattern in addition to the concentric circular pattern.

A wave retardation member 33 having a larger dielectric constant than that of a vacuum is provided on the upper surface of the planar antenna member 31. Since microwaves have a longer wavelength in a vacuum, the wave retardation member 33 functions to shorten the wavelength of microwaves to control the plasma. The planar antenna member 31 may be in contact with or separated from the transmitting plate 28 and the wave retardation member 33, but it is preferable that the planar antenna member 31 is in contact with the transmitting plate 28 and the wave retardation member 33, respectively.

A shield lid 34 made of a metal material, for example, aluminum or stainless steel is provided on the upper surface of the chamber 1 to cover the planar antenna member 31 and the wave retardation member 33. The upper surface of the chamber 1 and the shield lid 34 are sealed with a seal member 35. A cooling water path 34a is formed in the shield lid 34 to cool the shield lid 34, the wave retardation member 33, the planar antenna member 31 and the transmitting plate 28 by flowing cooling water therethrough. Further, the shield lid 34 is grounded.

An opening 36 is formed at an upper central portion of the shield lid 34 to be connected to the waveguide 37. A microwave generator 39 for generating microwaves is connected to an end portion of the waveguide 37 through a matching circuit 38. Accordingly, microwaves having a frequency of, for example, 2.45 GHz generated by the microwave generator 39 are propagated through the waveguide 37 to the planar antenna member 31. Further, microwaves having a frequency of 8.35 GHz or 1.98 GHz may be used.

The waveguide 37 includes a coaxial waveguide 37a having a circular cross section and extending upward from the opening 36 of the shield lid 34, and a rectangular waveguide 37b connected to an upper end of the coaxial waveguide 37a through a mode converter 40 and extending horizontally. The mode converter 40 provided between the rectangular waveguide 37b and the coaxial waveguide 37a functions to convert microwaves propagating in a TE mode through the rectangular waveguide 37b into TEM mode microwaves. An inner conductor 41 is installed at the center of the coaxial waveguide 37a and a lower end portion of the inner conductor 41 is fixedly connected to a central portion of the planar antenna member 31. Accordingly, the microwaves are efficiently, uniformly and radially propagated to the planar antenna member 31 through the inner conductor 41 of the coaxial waveguide 37a.

Each component of the plasma processing apparatus 100 is connected to and controlled by a process controller 50 having a CPU. A user interface 51, including a keyboard for inputting commands or a display for displaying an operation status of the plasma processing apparatus 100, is connected to the process controller 50 to allow a process manager to manage the plasma processing apparatus 100.

Further, the process controller 50 is connected to a storage unit 52 which stores recipes including control programs (software) for implementing various processes in the plasma processing apparatus 100 under control of the process controller 50, process condition data and the like.

If necessary, as a certain recipe is retrieved from the storage unit 52 in accordance with an instruction inputted through the user interface 51 and transmitted to the process controller 50, a desired process is performed in the plasma processing apparatus 100 under control of the process controller 50. Further, the recipes including control programs, process condition data and the like can be stored in and retrieved from a computer-readable storage medium such as a CD-ROM, a hard disk, a flexible disk and a flash memory, or retrieved through an on-line connected via, for example, a dedicated line to another apparatus available all the time.

The plasma processing apparatus 100 can not only perform a plasma process without damaging a base film or the like at a low temperature of 800° C. or less, but also realize excellent plasma uniformity and process uniformity.

In the RLSA type plasma processing apparatus 100, a silicon nitride film can be deposited on the surface of the wafer W in the following steps using a plasma CVD method.

First, the wafer W is loaded into the chamber 1 through the loading/unloading port 25 by opening the gate valve 26 and mounted on the mounting table 2. Then, N-containing gas and Si-containing gas are introduced into the chamber 1 at predetermined flow rates, respectively, through the gas inlets 15*a* and 16*b* from the N-containing gas supply source 17 and the Si-containing gas supply source 18 of the gas supply system 16.

Next, the microwaves generated from the microwave generator 39 are transmitted to the waveguide 37 through the matching circuit 38. After the microwaves sequentially pass through the rectangular waveguide 37*b*, the mode converter 40, and the coaxial waveguide 37*a*, the microwaves are supplied to the planar antenna member 31 through the inner conductor 41. Then, the microwaves are radiated into a space above the wafer W in the chamber 1 through the slots of the planar antenna member 31 and the transmitting plate 28. The microwaves propagate in a TE mode in the rectangular waveguide 37*b* and are converted into TEM mode microwaves by the mode converter 40 to propagate in the coaxial waveguide 37*a* toward the planar antenna member 31. For example, output power of the microwaves may range from 500 to 3000 W.

An electromagnetic field is formed in the chamber 1 by the microwaves radiated into the chamber 1 from the planar antenna member 31 through the transmitting plate 28, thereby converting the N-containing gas and the Si-containing gas into plasma. The microwave-excited plasma produced by the radiation of the microwaves through the plural holes 32 of the planar antenna member 31 has a high density of about $1\times10^{10}$ to $5\times10^{12}/cm^3$ and a low electron temperature of about 1.5 eV or less in the vicinity of the wafer W. The microwave-excited plasma causes little ion-induced damage to the base film and has a high density. Accordingly, the source gases are highly dissociated in the plasma to produce active species such as SiH, NH, N, and H by high density plasma. The active species react with each other to deposit a thin film of silicon nitride SixNy (x and y are not necessarily determined based on stoichiometry and have different values according to conditions).

In the present invention, the direction and strength of stress of the silicon nitride film can be controlled by selecting film formation conditions in a plasma CVD method. Specifically, for example, when a tensile stress is applied to the silicon nitride film during formation thereof, it is preferable to use a $NH_3$ gas as the N-containing gas and a $Si_2H_6$ gas as the silicon-containing gas. In this case, a flow rate of $NH_3$ gas is set at 100 to 3000 mL/min (sccm), preferably, 400 to 1000 mL/min (sccm), and a flow rate of $Si_2H_6$ gas is set at 1 to 30 mL/min (sccm), preferably, 5 to 20 mL/min (sccm).

When the $Si_2H_6$ gas and $NH_3$ gas are used, a silicon nitride film having a high tensile stress can be formed by setting a process pressure to be slightly high in the plasma CVD. For example, in order to form a silicon nitride film having a tensile stress of 400 MPa or more by using $Si_2H_6$ gas and $NH_3$ gas, it is preferable to set a process pressure at 6.7 Pa (50 mTorr) or more. Further, in order to form a silicon nitride film having a high tensile stress of 800 MPa or more, for example, 800 to 2000 MPa, it is preferable to set a process pressure at 40 Pa or more, for example, 40 to 266.6 Pa (300 mTorr to 2 Torr). Further, in order to form a silicon nitride film having a high tensile stress of 1000 MPa or more, for example, 1000 to 2000 MPa, it is preferable to set a process pressure at 53.3 Pa or more, for example, 53.3 to 266.6 Pa (400 mTorr to 2 Torr). Further, in order to form a silicon nitride film having a high tensile stress of 1500 MPa or more, for example, 1500 to 2000 MPa, it is preferable to set a process pressure at 133.3 Pa or more, for example, 133.3 to 266.6 Pa (1 Torr to 2 Torr).

When a process pressure is kept constant, as a process temperature of plasma CVD becomes higher, the tensile stress of the silicon nitride film tends to be stronger. Accordingly, it is preferable to heat the mounting table 2 to 300 to 800° C. Further, since a film can be formed at a low temperature in the plasma CVD method, it is more preferable to heat the mounting table 2 to 300 to 450° C. in a viewpoint of the manufacture of devices.

Further, as a gap G (distance from the bottom surface of the transmitting plate 28 to the upper surface of the mounting table 2) in the plasma processing apparatus 100 becomes larger, the tensile stress of the silicon nitride film tends to be stronger. Accordingly, it is preferable to set the gap G to be, for example, about 100 to 300 mm.

When a compressive stress is applied to a silicon nitride film during formation thereof, it is preferable to use a $N_2$ gas as the N-containing gas and a $Si_2H_6$ gas as the Si-containing gas. In this case, a flow rate of $N_2$ gas is set at 100 to 3000 mL/min (sccm), preferably, 800 to 2000 mL/min (sccm), and a flow rate of $Si_2H_6$ gas is set at 1 to 30 mL/min (sccm), preferably, 1 to 10 mL/min (sccm).

When the $Si_2H_6$ gas and $N_2$ gas are used, a silicon nitride film having a high compressive stress can be formed by setting a process pressure to be slightly low in the plasma CVD. For example, in order to form a silicon nitride film having a compressive stress of, for example, 800 MPa or more by using $Si_2H_6$ gas and $N_2$ gas, it is preferable to set a process pressure less than 5.3 Pa (40 mTorr), for example, 1.3 to 5.3 Pa (10 mTorr to 40 mTorr). Further, in order to form a silicon nitride film having a high compressive stress of 1000 MPa or more, for example, 1000 to 2000 MPa, it is preferable to set a process pressure at 4 Pa or less, for example, 1.3 to 4 Pa (10 mTorr to 30 mTorr).

When a process pressure is kept constant, as a process temperature of plasma CVD becomes higher, the compressive stress of the silicon nitride film tends to be stronger. Accordingly, it is preferable to heat the mounting table 2 to 300 to 800° C., more preferably, 300 to 450° C. in a viewpoint of the manufacture of devices.

Further, as the gap G (distance from the bottom surface of the transmitting plate 28 to the upper surface of the mounting table 2) in the plasma processing apparatus 100 becomes larger, the compressive stress of the silicon nitride film tends to be stronger. Accordingly, it is preferable to set the gap G to be, for example, about 100 to 300 mm.

As explained above, as the film formation is performed by using the plasma processing apparatus 100 and selecting the plasma CVD conditions, it is possible to precisely control the (tensile/compressive) direction and magnitude of stress of the silicon nitride film.

Figure 3:
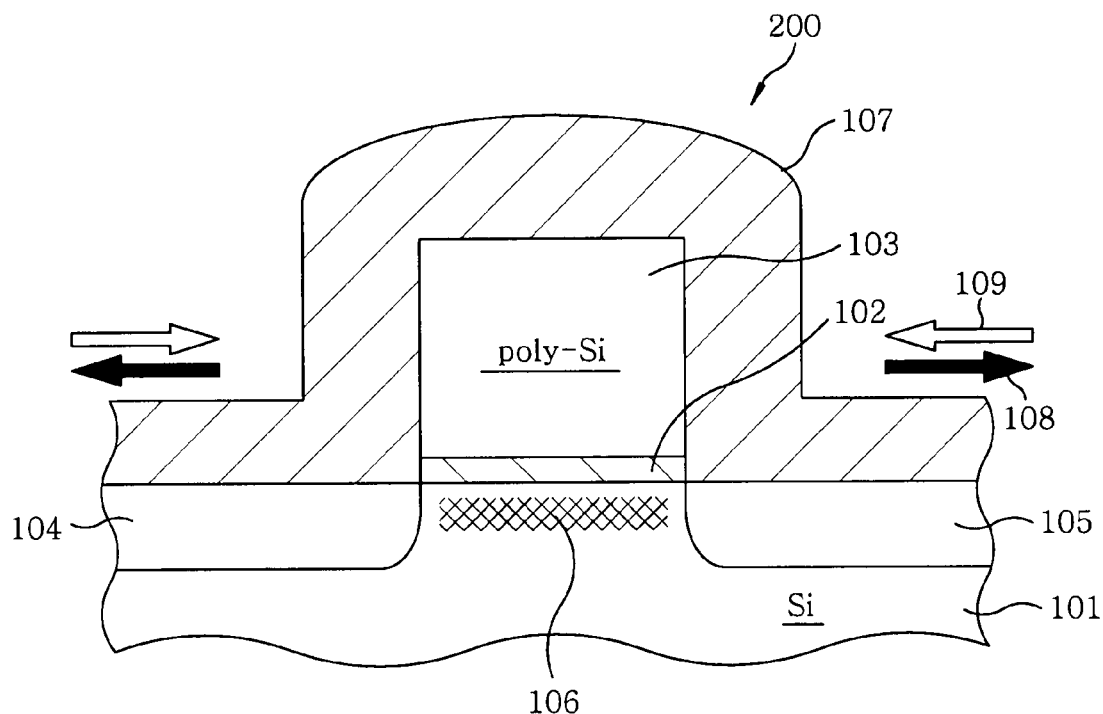
FIG. 3 schematically shows a cross sectional view of a transistor in which a silicon nitride film having a stress is used as a coating film.

Next, an application example of the silicon nitride film formed by using the plasma processing apparatus 100 and the plasma CVD method will be described with reference to FIGS. 3 and 4A to 4C. FIG. 3 schematically shows a cross sectional view of a metal-oxide-silicon (MOS) transistor 200. The MOS transistor 200 includes a gate electrode 103 formed on a P-type or N-type Si layer 101 via a gate insulating film 102 and made of, for example, polysilicon. A source 104 and a drain 105 are formed at both side regions of the gate electrode 103, and a channel region 106 (portion designated by net-shaped lines in FIG. 3) is formed between the source 104 and the drain 105. Further, an insulating coating film (liner) 107 having a high stress is formed to cover the gate electrode 103. In this application example, the coating film 107 may be formed by using the plasma processing apparatus 100 and the plasma CVD method. As described above, the coating film 107 may have a tensile or compressive stress by controlling the plasma CVD conditions.

For instance, when a silicon nitride film having a tensile stress is used as the coating film 107, a stress is applied to the coating film (insulating film) 107 in directions represented by black arrows 108 of FIG. 3. Further, a stress is applied to silicon of the source 104 and the drain 105 in contact with the coating film (insulating film) 107 in the same directions as the black arrows 108. Hence, a stress is also applied to the channel region 106 in the same directions as the black arrows 108, thereby causing a tensile distortion in the channel region 106.

On the other hand, when the coating film 107 has a compressive stress, a stress is applied to the coating film (insulating film) 107 in directions represented by white arrows 109 of FIG. 3. Further, a stress is applied to silicon of the source 104 and the drain 105 in contact with the coating film (insulating film) 107 in the same directions as the white arrows 109. Hence, a stress is also applied to the channel region 106 in the same directions as the white arrows 109, thereby causing a compressive distortion in the channel region 106.

When the transistor 200 is an NMOS transistor which uses electrons as carriers, a tensile distortion applied to the channel region 106 increases mobility, whereas a compressive distortion applied to the channel region 106 decreases mobility. On the other hand, when the transistor 200 is a PMOS transistor which uses holes as carriers, a compressive distortion applied to the channel region 106 increases mobility, whereas a tensile distortion applied to the channel region 106 decreases mobility.

Hence, when the transistor 200 is an NMOS transistor, saturation drive current or linear drive current can be increased by employing a silicon nitride film having a tensile stress as the coating film (insulating film) 107 and applying a tensile distortion to the channel region 106. Further, when the transistor 200 is a PMOS transistor, saturation drive current or linear drive current can be increased by employing a silicon nitride film having a compressive stress as the coating film (insulating film) 107 and applying a compressive distortion to the channel region 106. As described above, the driving performance of the transistor 200 can be improved by using a silicon nitride film having a tensile or compressive stress as the coating film (insulating film) 107. As a result, it is possible to improve the performance of a semiconductor device including the transistor 200.

Although the silicon nitride film having a stress is only used as the coating film (insulating film) 107 in FIG. 3, the silicon nitride film having a stress may be also used as, for example, sidewalls formed at opposite sides of the gate electrode 103.

Figure 4A:
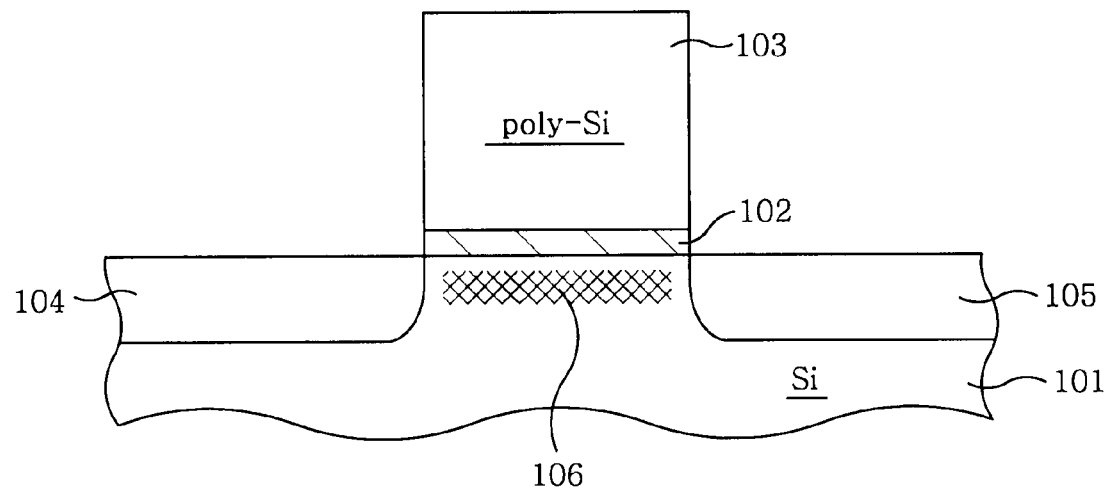
FIG. 4A is a cross sectional view showing a step of a method for manufacturing a semiconductor device by using a plasma CVD method in accordance with an embodiment of the present invention, which shows a state before a silicon nitride film is formed.
Figure 4B:
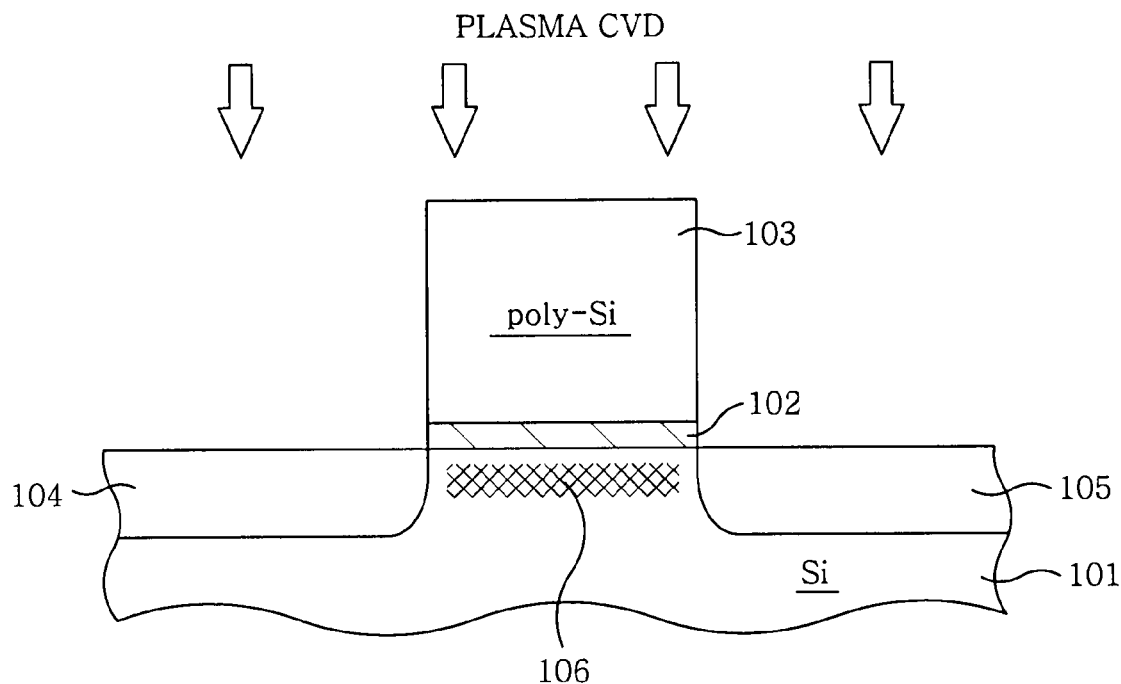
FIG. 4B is a cross sectional view showing a step of a method for manufacturing a semiconductor device by using a plasma CVD method in accordance with an embodiment of the present invention, which shows a state during a plasma CVD process.
Figure 4C:
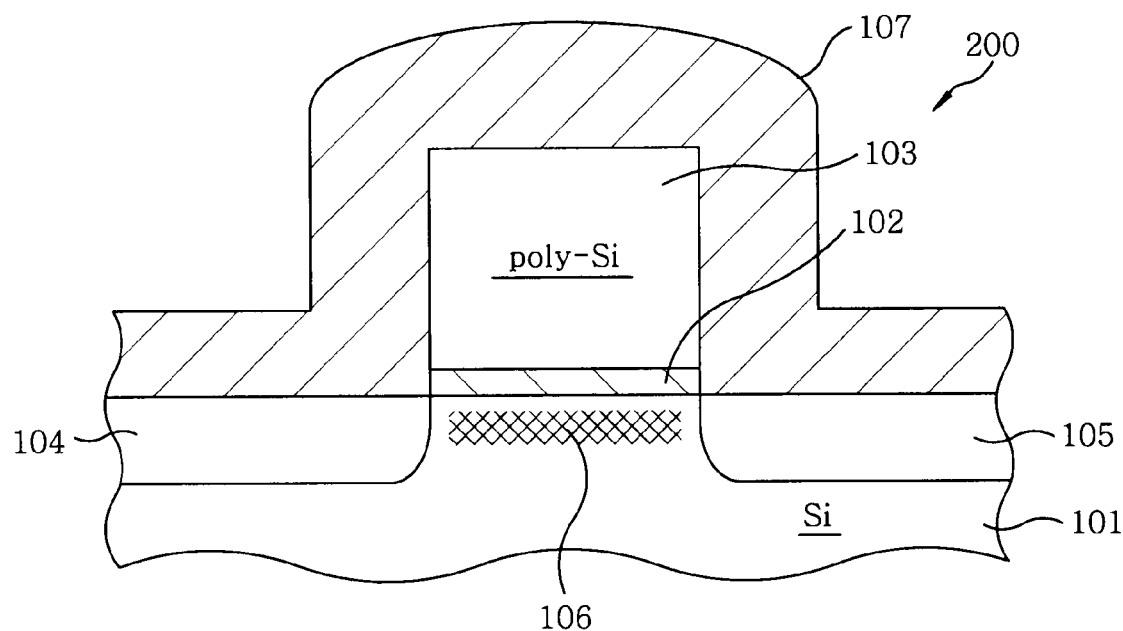
FIG. 4C is a cross sectional view showing a step of a method for manufacturing a semiconductor device by using a plasma CVD method in accordance with an embodiment of the present invention, which shows a state after a silicon nitride film having a stress is formed by plasma CVD.

For example, the transistor 200 may be manufactured by forming the coating film (insulating film) 107 of a silicon nitride film to cover the gate electrode 103, the source 104 and the drain 105 of the structure under conditions capable of applying a tensile or compressive stress thereto by using the plasma processing apparatus 100. FIGS. 4A to 4C illustrate cross sectional views showing the steps of a process for manufacturing the transistor 200 by using a plasma nitriding method in accordance with the present invention.

A transistor structure shown in FIG. 4A may be formed as follows. First, a well (not shown) is formed in the P-type or N-type Si layer 101, and a device isolation layer is formed by, for example, a LOCOS method or shallow trench isolation (STI) method. Then, the gate insulating film 102 of a silicon nitride film, silicon oxide film or the like is formed on the surface of the Si layer 101 by a plasma processing method or heat treatment method. After a polysilicon layer is formed on the gate insulation layer 102 by using, for example, a CVD method, the polysilicon layer is etched through a mask pattern formed by using a photolithography technique to form the gate electrode 103. The structure of the gate electrode is not limited to a single layer structure of the polysilicon layer. That is, the gate electrode may have a stack structure including, for example, tungsten, molybdenum, tantalum, titanium, and silicide, nitride and an alloy thereof in order to decrease the resistivity of the gate electrode and to achieve a high speed transistor. As described above, after the gate electrode 103 is formed, ion implantation and activation are performed to form the source 104 and the drain 105.

Then, as shown in FIG. 4B, a silicon nitride film having a tensile or compressive stress is formed by using the plasma processing apparatus 100 to cover the surface of the Si layer 101 and the gate electrode 103. Then, an unnecessary portion of the silicon nitride film is removed based on a mask pattern formed by a photolithography technique to form the coating film (insulating film) 107, thereby manufacturing the MOS transistor 200 as shown in FIG. 4C. If necessary, an annealing process may be performed on the coating film (insulating film) 107.

Figure 5:
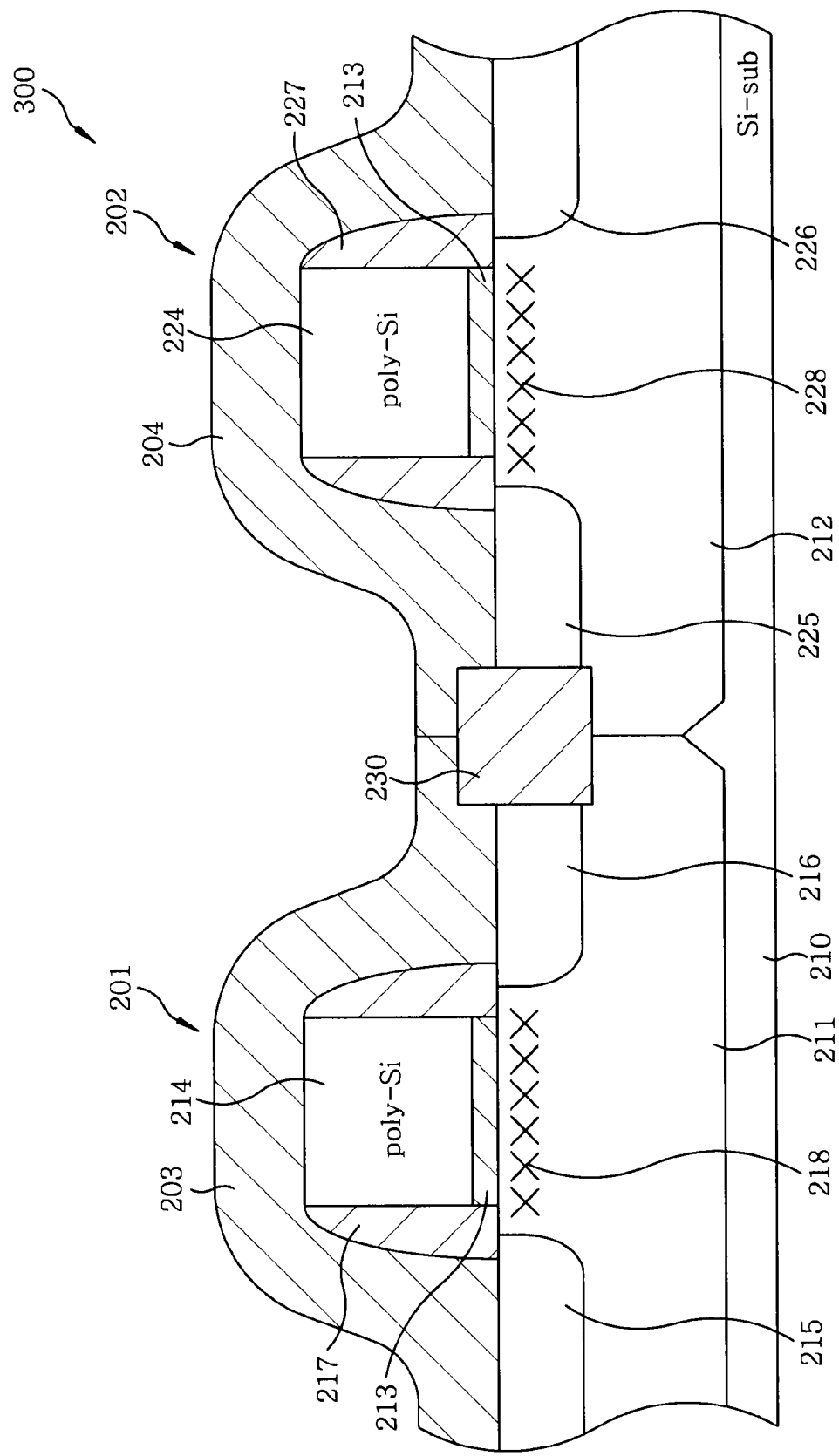
FIG. 5 schematically shows a cross sectional view of a CMOS transistor in which a silicon nitride film having a stress is used as a coating film.

Further, when a CMOS transistor 300 shown in FIG. 5 is manufactured, film formation, patterning using photolithography, and etching are sequentially performed to form an NMOS region 201 and a PMOS region 202. Further, coating films (insulating films) 203 and 204 may be formed in the NMOS region 201 and the PMOS region 202, respectively, by forming silicon nitride films under conditions capable of applying a tensile or compressive stress thereto in accordance with the present invention and etching the silicon nitride films.

Specifically, a p-type well 211 and an n-type well 212 for forming the NMOS region 201 and the PMOS region 202 are formed in a silicon substrate 210, respectively. A poly-Si gate electrode 214 is formed on a main surface of the p-type well 211 through a gate insulating film 213. A source 215 and a drain 216 are formed at both side regions of the gate electrode 214. Then, sidewalls 217 are formed on both sides of the gate electrode 214. Meanwhile, a poly-Si gate electrode 224 is formed on a main surface of the n-type well 212 through a gate insulating film 213. A source 225 and a drain 226 are formed at both side regions of the gate electrode 224. Then, sidewalls 227 are formed on both sides of the gate electrode 224. Further, a reference numeral 230 designates a device isolation region. In this case, the steps are performed as described in FIGS. 4A to 4C.

After the NMOS region 201 and the PMOS region 202 are formed, the silicon nitride film having a tensile stress is deposited on an entire surface of the structure by using the plasma processing apparatus 100. The silicon nitride film having a tensile stress in the PMOS region 202 is removed by etching to remain the coating film (insulating film) 203 of the silicon nitride film having a tensile stress only in the NMOS region 201.

Thereafter, a silicon nitride film having a compressive stress is deposited on the wafer W by using the plasma processing apparatus 100. Then, the silicon nitride film having a compressive stress in the NMOS region 201 is removed by etching to remain the coating film (insulating film) 204 of the silicon nitride film having a compressive stress only in the PMOS region 202. Consequently, a CMOS transistor having an improved performance can be manufactured by using the stresses of the silicon nitride films to cause a tensile distortion in a channel region 218 of the NMOS region 201 and a compressive distortion in a channel region 228 of the PMOS region 202.

Figure 6:
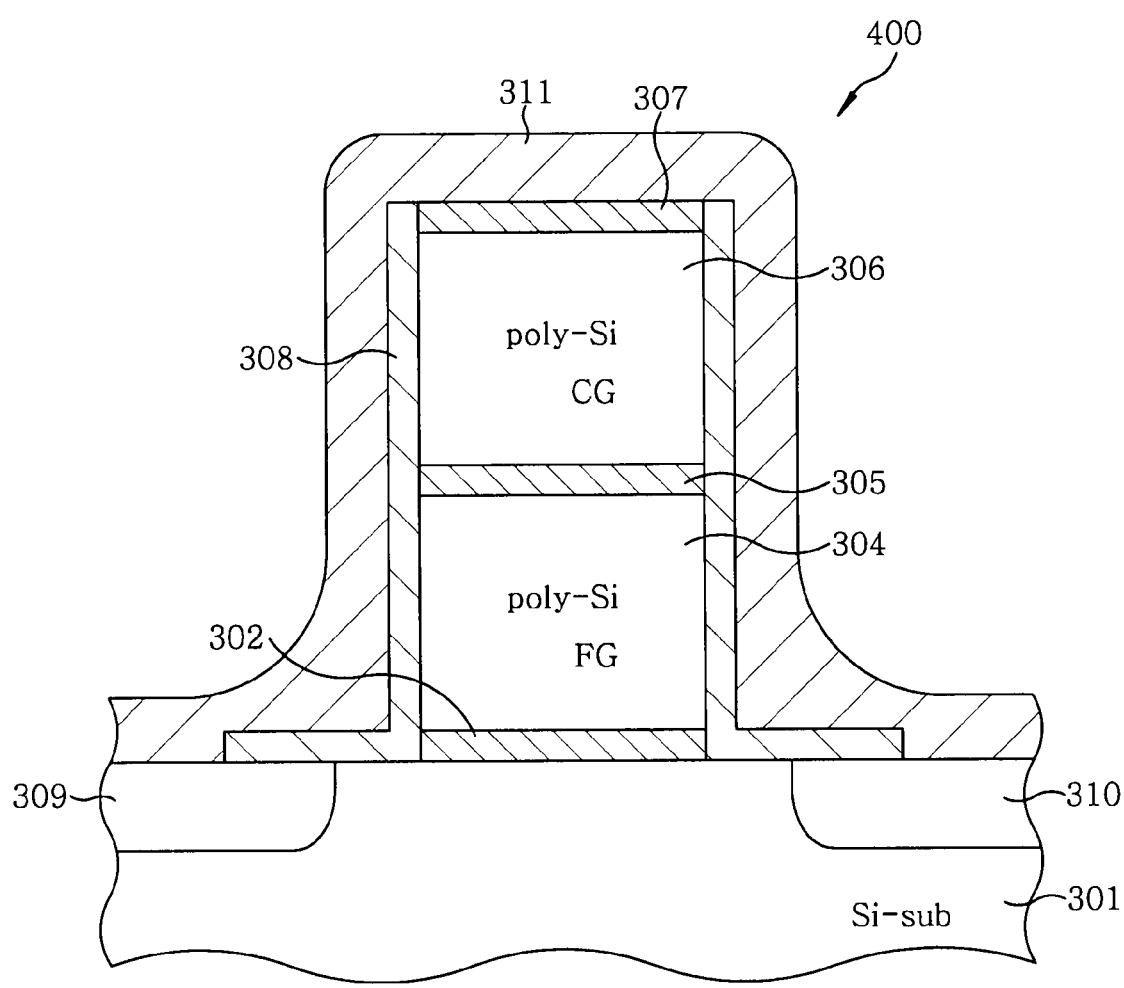
FIG. 6 schematically shows a cross sectional view of a nonvolatile memory in which a silicon nitride film having a stress is used as a coating film.

Further, the silicon nitride film formed by using the plasma processing apparatus 100 and the plasma CVD may be also applied to a nonvolatile memory 400 shown in FIG. 6. In the nonvolatile memory 400, a tunnel oxide film 302 is formed on a main surface of a Si substrate 301, and a floating gate (FG) 304 made of polysilicon is formed thereon. A dielectric film 305 having, for example, an oxide-nitride-oxide (ONO) structure is formed on the floating gate 304. Further, a control gate (CG) 306 made of polysilicon is formed on the dielectric film 305. An insulating layer 307 is formed on the control gate 306. Then, an oxidation treatment is performed to form a sidewall oxide film 308 at sidewalls of both the floating gate 304 and the control gate 306. A source 309 and a drain 310 are formed at both side regions of the floating gate 304 formed on the main surface of the Si substrate 301. A coating film (insulating film) 311 of a silicon nitride film having a stress is formed to cover the floating gate 304, the control gate 306, the source 309 and the drain 310.

As described above, a distortion can be appropriately applied to the floating gate 304 by forming a silicon nitride film having a stress as the coating film (insulating film) 311. In the nonvolatile memory 400, charges of the floating gate 304 may be lost by tunneling into the Si substrate to cause tunneling current after passing through the tunnel oxide film, thereby causing loss of memory. However, average electron mass and a width of a $SiO_2$ barrier of the tunnel oxide film 302 may increase to reduce the tunneling current by appropriately applying a distortion to the floating gate 304. Thus, the floating gate 304 can stably maintain charges.

Next, an explanation is given of the experimental results which provide a basis for the present invention.

Figure 7:
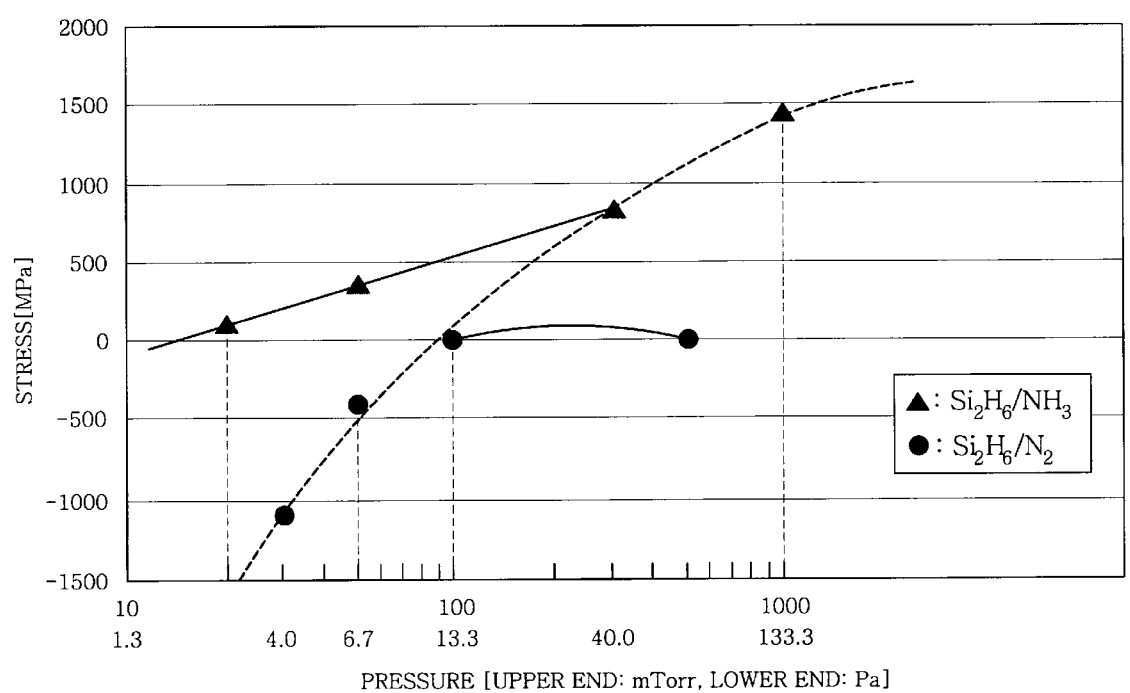
FIG. 7 is a graph showing the relationship between a stress of the silicon nitride film and a pressure in plasma CVD.

First, silicon nitride films were formed under various conditions by using the plasma processing apparatus 100 and the stress of each silicon nitride film was measured. FIG. 7 is a graph showing a relationship between a process pressure and a stress of the silicon nitride film in the plasma CVD. A vertical axis of the graph shown in FIG. 7 represents a stress of the silicon nitride film, wherein a positive (plus) value represents a tensile stress and a negative (minus) value represents a compressive stress (in the same way in FIGS. 9, 10, 13A, 13B, 16A and 16B). Further, a horizontal axis of the graph shown in FIG. 7 represents a process pressure (mTorr) in log scale, wherein pressure values (mTorr) in an upper line are converted into pressure values (Pa) in a lower line (in the same way in FIGS. 10, 11 and 12).

In the experiment, silicon nitride films having a tensile stress were formed under the following plasma CVD conditions.

<Conditions for Plasma CVD Film Formation ($NH_3/Si_2H_6$ Gas Atmosphere)>
$NH_3$ gas flow rate: 500 mL/min (sccm)
$Si_2H_6$ gas flow rate: 5 mL/min (sccm)
Process pressure: 2.7 Pa (20 mTorr), 6.7 Pa (50 mTorr), 40.0 Pa (300 mTorr) and 133.3 Pa (1 Torr)
Temperature of mounting table 2: 400° C.
Microwave power: 2000 W Further, silicon nitride films having a compressive stress were formed under the following plasma CVD conditions.

<Conditions for Plasma CVD Film Formation ($N_2/Si_2H_6$ Gas Atmosphere)>
$N_2$ gas flow rate (gas inlet 15a): 1100 mL/min (sccm)
$Si_2H_6$ gas flow rate: 1 mL/min (sccm)
$N_2$ gas flow rate (gas inlet 15b): 100 mL/min (sccm)
Process pressure: 4.0 Pa (30 mTorr), 6.7 Pa (50 mTorr), 13.3 Pa (100 mTorr) and 66.6 Pa (500 mTorr)
Temperature of mounting table 2: 500° C.
Microwave power: 3000 W When film formation is performed under an $NH_3/Si_2H_6$ gas atmosphere, as is apparent from the graph of FIG. 7, a tensile stress occurs in each silicon nitride film and tends to increase as the process pressure increases. A tensile stress of about 400 MPa was obtained at a process pressure of about 6.7 Pa. Hence, when a tensile stress is applied to the silicon nitride film, the process pressure is preferably set to be 6.7 Pa (50 mTorr) or more. Further, in order to form a silicon nitride film having a high tensile stress of 800 MPa or more, for example, 800 to 2000 MPa, it is preferable to set a process pressure to be 40 MPa or more, for example, 40 to 266.6 Pa (300 mTorr to 2 Torr). Further, in order to form a silicon nitride film having a high tensile stress of 1000 MPa or more, for example, 1000 to 2000 MPa, it is preferable to set a process pressure to be 53.3 Pa or more, for example, 53.3 to 266.6 Pa (400 mTorr to 2 Torr). Further, in order to form a silicon nitride film having a high tensile stress of 1500 MPa or more, for example, 1500 to 2000 MPa, it is preferable to set a process pressure to be 133.3 Pa or more, for example, 133.3 to 266.6 Pa (1 Torr to 2 Torr).

Further, when film formation is performed under an $N_2/Si_2H_6$ gas atmosphere, a compressive stress occurs in each silicon nitride film and tends to increase as the process pressure decreases. A compressive stress larger than about 800 MPa was obtained at a process pressure less than about 5.3 Pa (40 mTorr). Accordingly, when a compressive stress is applied to the silicon nitride film, the process pressure is preferably set to be smaller than 5.3 Pa (40 mTorr). Further, in order to form a silicon nitride film having a high compressive stress of 1000 MPa or more, for example, 1000 to 1500 MPa, it is preferable to set a process pressure to be 4 Pa or less, for example, 1.3 to 4 Pa (10 mTorr to 30 mTorr).

It could be seen from FIG. 7 that the direction and strength of the stress can be precisely controlled by adjusting gas species and a process pressure in the plasma CVD.

Figure 8A:
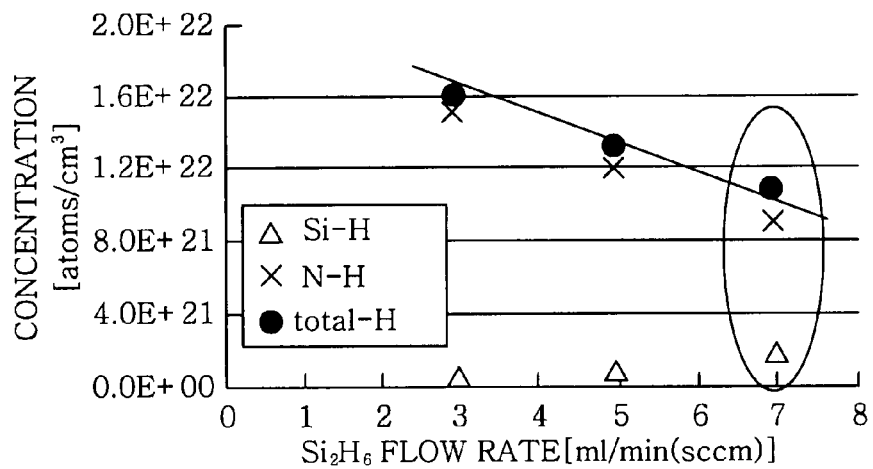
FIG. 8A is a graph showing the relationship between a hydrogen concentration in the silicon nitride film and a $Si_2H_6$ flow rate in plasma CVD at a process pressure of 40.0 Pa.
Figure 8B:
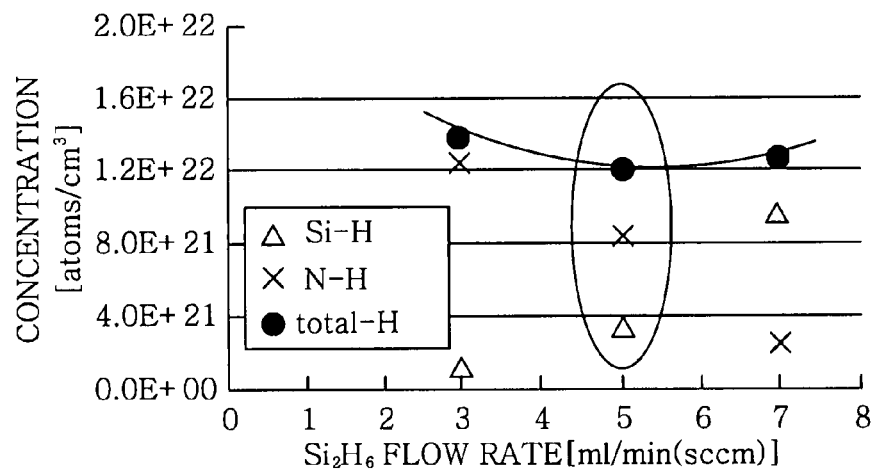
FIG. 8B is a graph showing the relationship between a hydrogen concentration in the silicon nitride film and a $Si_2H_6$ flow rate in plasma CVD at a process pressure of 133.3 Pa.
Figure 8C:
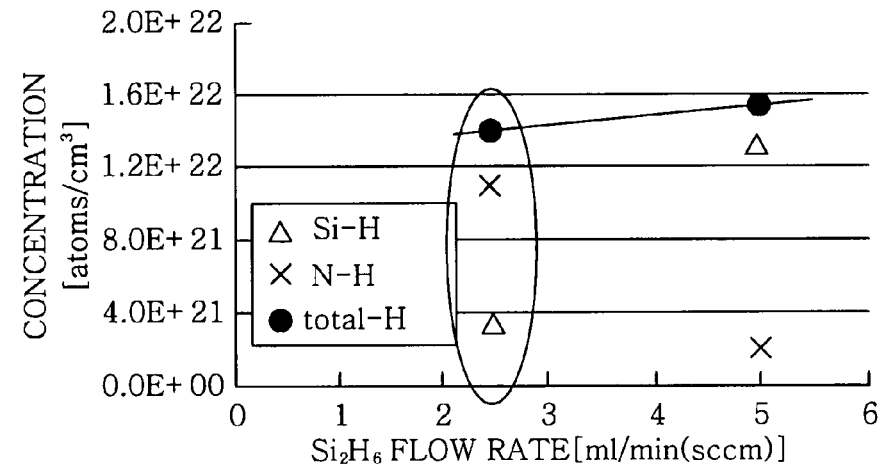
FIG. 8C is a graph showing the relationship between a hydrogen concentration in the silicon nitride film and a $Si_2H_6$ flow rate in plasma CVD at a process pressure of 400 Pa.

Next, silicon nitride films were formed by using the plasma processing apparatus 100 while a $Si_2H_6$ flow rate is changed, and hydrogen concentrations (Si—H and N—H concentrations) of the silicon nitride films were measured. FIGS. 8A to 8C are graphs showing the relationship between $Si_2H_6$ flow rates and hydrogen concentrations (Si—H concentration and N—H concentration) in the silicon nitride films. The process pressure of the plasma CVD was set to be 40.0 Pa (300 mTorr) in FIG. 8A, 133.3 Pa (1 Torr) in FIG. 8B, and 400 Pa (3 Torr) in FIG. 8C. Further, a nitrogen-containing gas, i.e., $NH_3$ gas, was supplied at a flow rate of 500 mL/min (sccm) while a process temperature was set to be 500° C.; microwave power, 2 kW; and a gap G, 155 mm. In the graphs of FIGS. 8A to 8C, "Total-H" represents a sum of Si—H and N—H concentrations in the silicon nitride films.

From the comparison of FIGS. 8A to 8C, it was recognized that the effect of change in $Si_2H_6$ flow rate on hydrogen concentration was clearer at a process pressure of 40.0 Pa (300 mTorr) than at 133.3 Pa (1 Torr) or 400 Pa (3 Torr). The silicon nitride film formed by the plasma CVD tends to have a tensile stress as the hydrogen concentration in the silicon nitride film increases, and the tensile stress tends to be weakened as the hydrogen concentration decreases. Accordingly, when the process pressure is 40.0 Pa (300 mTorr), the tensile stress can be finely controlled by adjusting the $Si_2H_6$ flow rate.

Next, silicon nitride films were formed in an $NH_3/Si_2H_6$ gas atmosphere by using the plasma processing apparatus 100 while a $Si_2H_6$ gas flow rate and a process pressure are changed, and the stress of each silicon nitride film was measured. In this case, flow rates of $NH_3$ and Ar gases were constantly maintained at 400 mL/min (sccm) and 200 mL/min (sccm), respectively. Further, the $Si_2H_6$ gas flow rate was changed to 2 mL/min (sccm), 5 mL/min (sccm), and 10 mL/min (sccm) and the process pressure was changed within a range of 9.33 to 1333 Pa (70 to 10000 mTorr). Further, a process temperature was set at 400° C., and microwave power was set at 2 kW.

Figure 9:
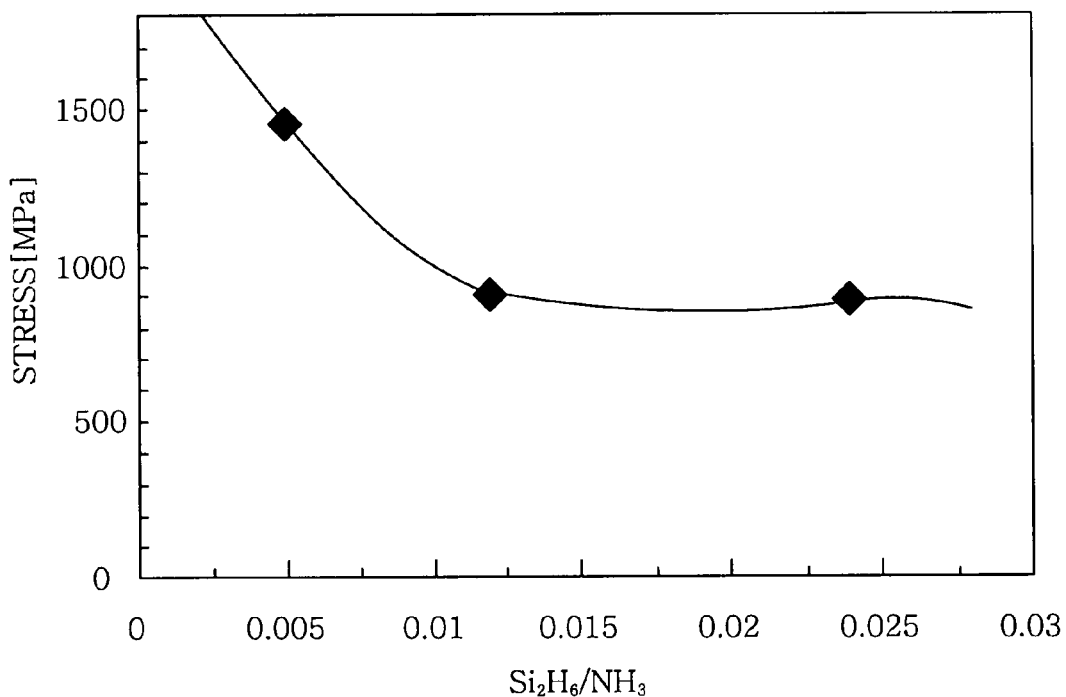
FIG. 9 is a graph showing the relationship between $Si_2H_6/NH_3$ and a stress applied to the silicon nitride film at a pressure of 666 Pa (5 Torr)

FIG. 9 is a graph showing the relationship between $Si_2H_6/NH_3$ and the stress applied to the silicon nitride films at a pressure of 666 Pa (5 Torr). It can be seen from the graph of FIG. 9 that the tensile stress increases as $Si_2H_6/NH_3$ decreases from 0.01 to 0. Accordingly, it was concluded that $Si_2H_6/NH_3$ is preferably set to be 0.01 or less when it is intended to apply a high tensile stress to the silicon nitride film at a relatively high pressure of 666 Pa (5 Torr).

Figure 10:
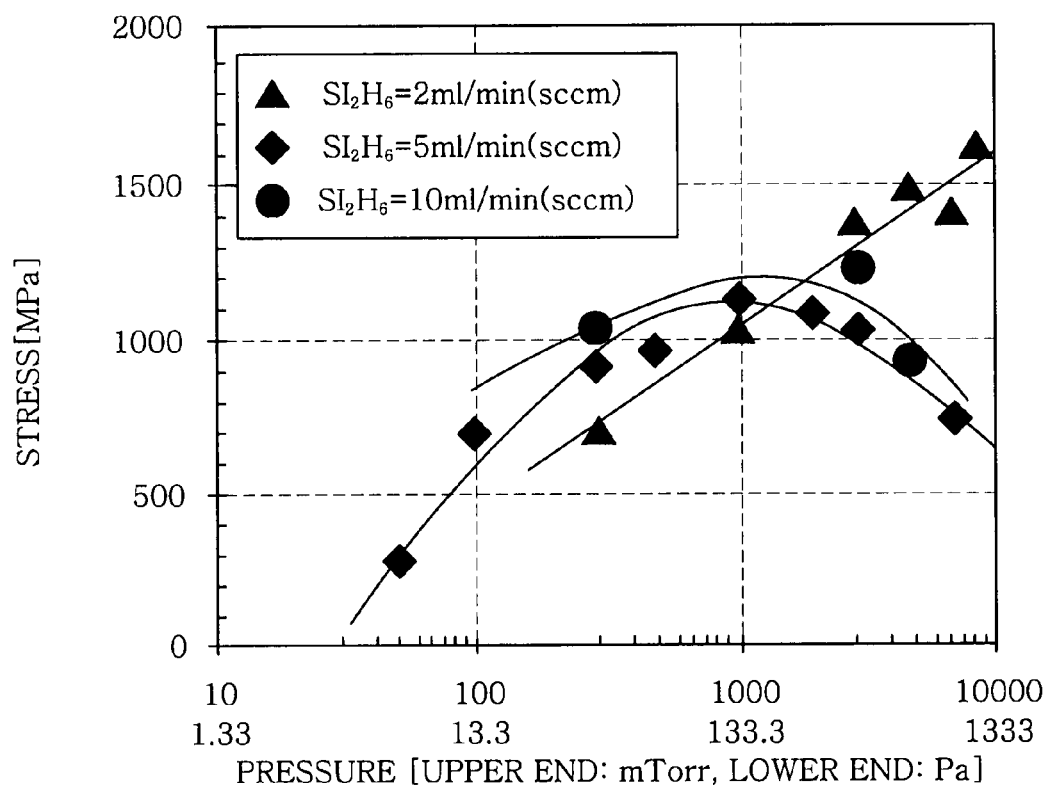
FIG. 10 is a graph showing the relationship between a process pressure and a stress of the silicon nitride film while a $Si_2H_6$ flow rate is changed to 2 mL/min (sccm), 5 mL/min (sccm) and 10 mL/min (sccm)

FIG. 10 is a graph showing the relationship between a process pressure and a tensile stress of the silicon nitride film while a $Si_2H_6$ flow rate is changed to 2 mL/min (sccm), 5 mL/min (sccm) and 10 mL/min (sccm), wherein a horizontal axis and a vertical axis of the graph represent a process pressure and a stress of the silicon nitride film, respectively. As is apparent from the graph, the tensile stress of the silicon nitride film increases as the process pressure increases to 133.3 Pa (1 Torr) regardless of a $Si_2H_6$ flow rate. However, when the flow rate of $Si_2H_6$ is 5 mL/min (sccm) or 10 mL/min (sccm), the tensile stress hardly increases at a process pressure exceeding 133.3 Pa (1 Torr), and decreases at a process pressure exceeding 266.6 Pa (2 Torr). On the other hand, when the flow rate of $Si_2H_6$ is 2 mL/min (sccm), the tensile stress continuously increases to 1333 Pa (10 Torr).

Figure 11:
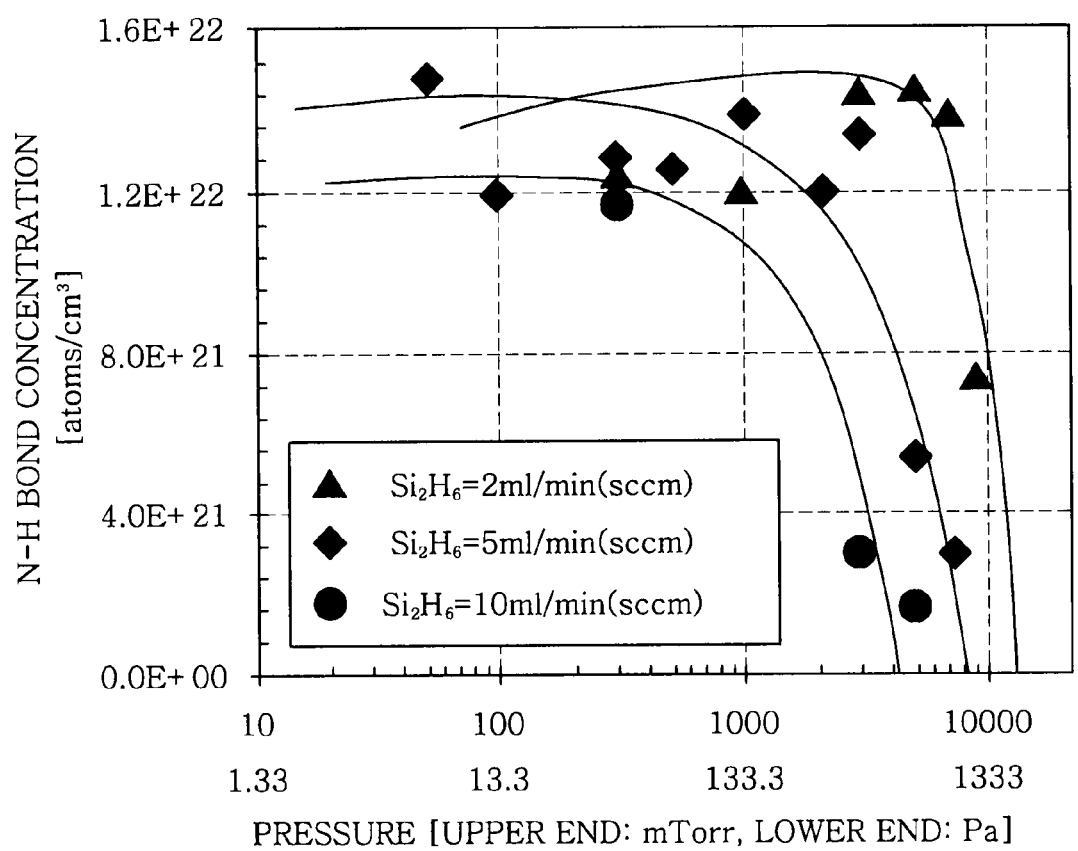
FIG. 11 is a graph showing the relationship between a process pressure and an N—H bond concentration at $Si_2H_6$ flow rates of 2 mL/min (sccm), 5 mL/min (sccm) and 10 mL/min (sccm)
Figure 12:
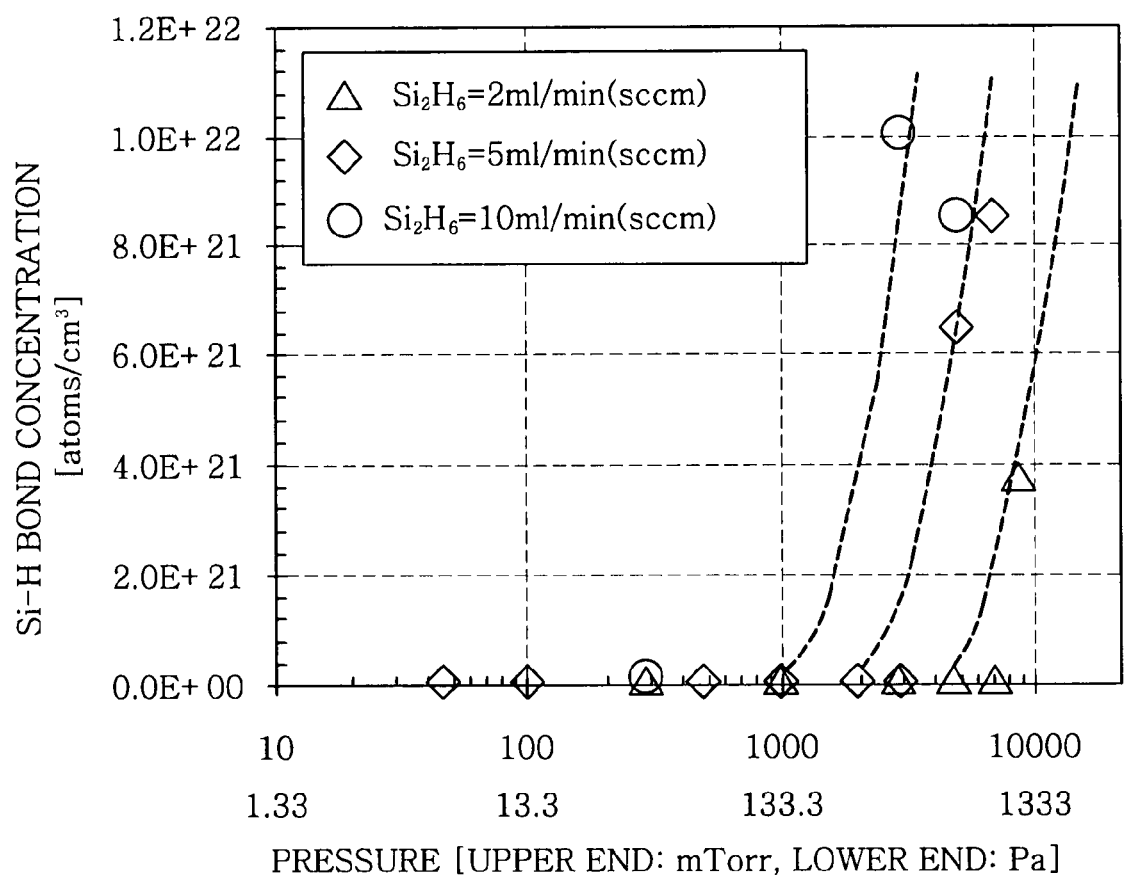
FIG. 12 is a graph showing the relationship between a process pressure and a Si—H bond concentration at $Si_2H_6$ flow rates of 2 mL/min (sccm), 5 mL/min (sccm) and 10 mL/min (sccm)

FIG. 11 is a graph showing the relationship between a process pressure and an N—H bond concentration at $Si_2H_6$ flow rates of 2 mL/min (sccm), 5 mL/min (sccm) and 10 mL/min (sccm), wherein a horizontal axis and a vertical axis of the graph represent a process pressure and an N—H bond concentration, respectively. FIG. 12 is a graph showing the relationship between a process pressure and a Si—H bond concentration at $Si_2H_6$ flow rates of 2 mL/min (sccm), 5 mL/min (sccm) and 10 mL/min (sccm), wherein a horizontal axis and a vertical axis of the graph represent a process pressure and a Si—H bond concentration, respectively. Referring to these figures and FIG. 10, when the flow rate of $Si_2H_6$ is 5 mL/min (sccm) or 10 mL/min (sccm), a high tensile stress occurs at a high N—H bond concentration and a Si—H bond concentration of approximately zero. In this case, a tensile stress decreases as an N—H bond concentration decreases and a Si—H bond concentration increases. That is, when $NH_3$ is excessively supplied, N—H bonds in the film increase under reaction rate control so that the tensile stress increases. On the other hand, when $Si_2H_6$ is excessively supplied, Si—H bonds increase under supply rate control so that the tensile stress decreases. Thus, when the flow rate of $Si_2H_6$ is lowered to 2 mL/min (sccm), a Si—H bond concentration does not increase and an N—H bond concentration is maintained even at a process pressure of 266 Pa (2 Torr) or more, so that the tensile stress increases to about 1333 Pa (10 Torr).

Figure 13A:
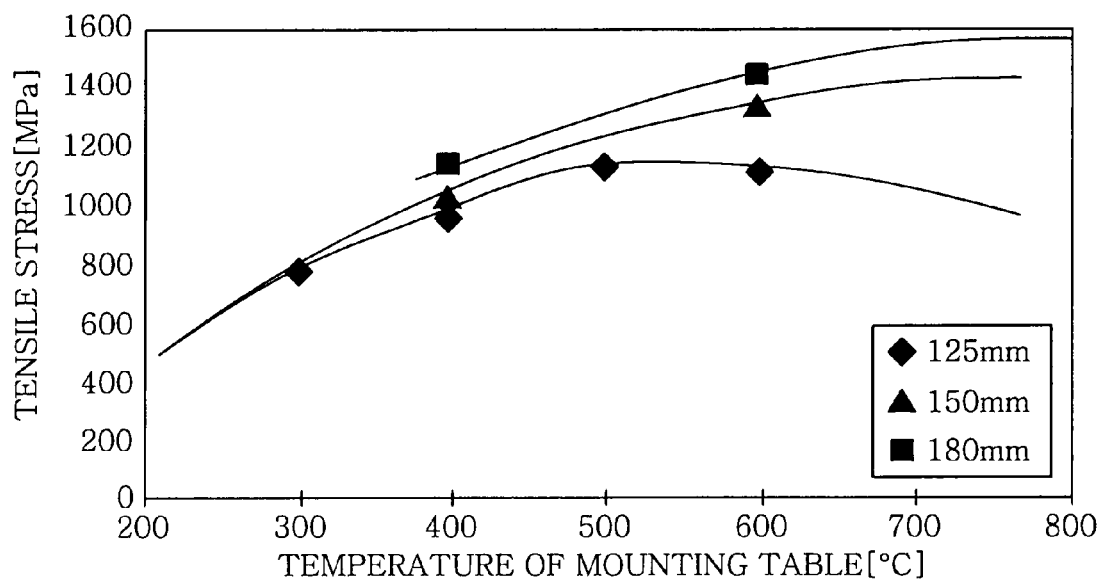
FIG. 13A is a graph showing the relationship among the stress of the silicon nitride film, the temperature and the gap in plasma CVD in a case of tensile stress.
Figure 13B:
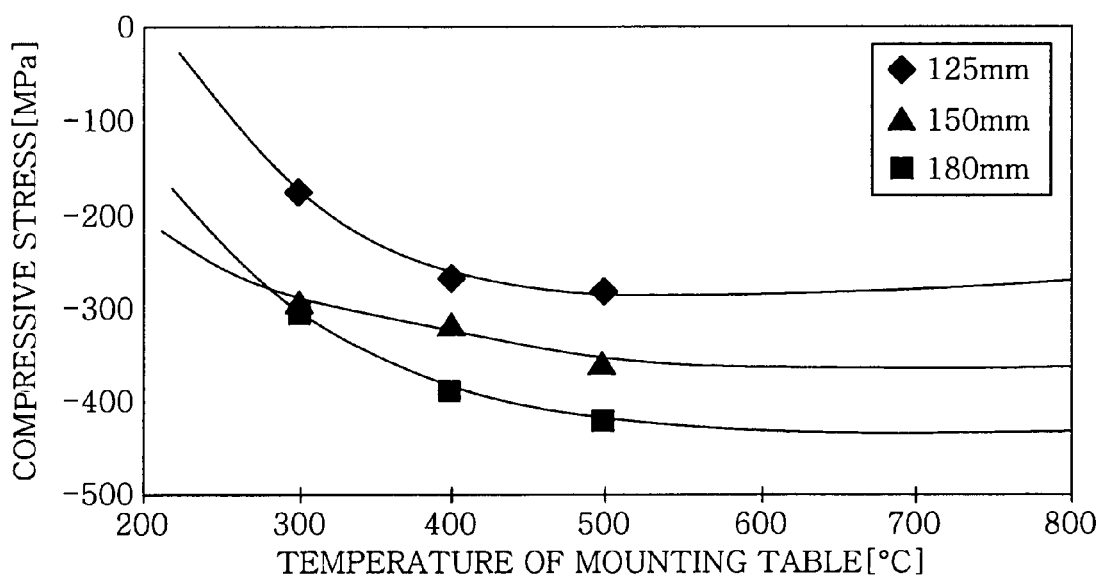
FIG. 13B is a graph showing the relationship among the stress of the silicon nitride film, the temperature and the gap in plasma CVD in a case of compressive stress.

Next, silicon nitride films were formed under various conditions by using the plasma processing apparatus 100, and the relationship among the temperature of the mounting table 2, the gap G and the stress was investigated. FIGS. 13A and 13B are graphs showing the relationship between the temperature of the mounting table and the stress at each gap, wherein tensile stress and compressive stress are shown in FIGS. 13A and 13B, respectively. In this experiment, the relationship between the temperature of the mounting table and the stress was investigated at each gap G of 125 mm, 150 min and 180 on. In this case, a $NH_3$ gas flow rate was set to be 500 mL/min (sccm); a $Si_2H_6$ gas flow rate, 5 mL/min (sccm); a process pressure, 133.3 Pa; and microwave power, 2 kW. It can be seen from the graphs of FIGS. 13A and 13B that both the tensile stress and the compressive stress tend to increase as the temperature of the mounting table 2 increases. Also, it can be seen that both the tensile stress and the compressive stress tend to increase as the gap G increases.

Thus, a high temperature is preferable in order to increase a stress whether a tensile or compressive stress is applied to the silicon nitride film. However, a low temperature is preferable in a viewpoint of the manufacture of devices. Also, one of advantages of plasma CVD is that film formation can be achieved at a low temperature. In consideration of these facts, it is preferable that the mounting table 2 is heated to a temperature of 300 to 450° C. Further, it is preferable that the gap G is set to be, for example, 100 to 300 mm.

Hereinafter, an explanation is given of test results showing effects of the present invention.

(1) Charge-up Damage Evaluation

A wafer (a diameter of 200 mm) including a plurality of MOS capacitors was used for the test. The test wafer includes 1 to 96 chips, each chip having six types of MOS capacitors in which antenna ratios AAR (area ratios of polysilicon electrodes and gate insulating films of the MOS capacitors) are 10, 100, 1,000, 10,000, 100,000 and 1,000,000. After a silicon nitride film was formed on a surface of the test wafer by using the plasma processing apparatus 100, damage of the MOS capacitors was evaluated by leakage current obtained from the current-voltage characteristics of the MOS capacitors. In this test, failure (charge-up damage) was determined when Jg exceeds $1 \times 10^{-9}$ [$A/\mu m^2$] at $-4.375$ V ($-12.5$ MV/cm).

A silicon nitride film having a tensile stress was formed by using the plasma processing apparatus 100 of FIG. 1 under the plasma CVD conditions in which a $NH_3$ gas flow rate is set to be 500 mL/min (sccm); a $Si_2H_6$ gas flow rate, 5 mL/min (sccm); a process pressure, 133.3 Pa (1 Torr); a temperature of the mounting table 2, 500° C.; microwave power, 2000 W; and the gap, 180 mm. The silicon nitride film was formed to have a tensile stress of about 1500 MPa.

A silicon nitride film having a compressive stress was formed by using the plasma processing apparatus 100 of FIG. 1 under the plasma CVD conditions in which a $N_2$ gas flow rate supplied through the gas inlet 15a is set to be 1100 mL/min (sccm); a $N_2$ gas flow rate and a $Si_2H_6$ gas flow rate supplied through the gas inlet 15b, 100 mL/min (sccm) and 1 mL/min (sccm), respectively; a process pressure, 2.66 Pa (20 mTorr); a temperature of the mounting table 2, 500° C.; microwave power, 3000 W; and the gap, 180 mm. The silicon nitride film was formed to have a compressive stress of about 1000 MPa.

Both the films having tensile and compressive stresses were formed to have a thickness of 20 mm.

Figure 14:
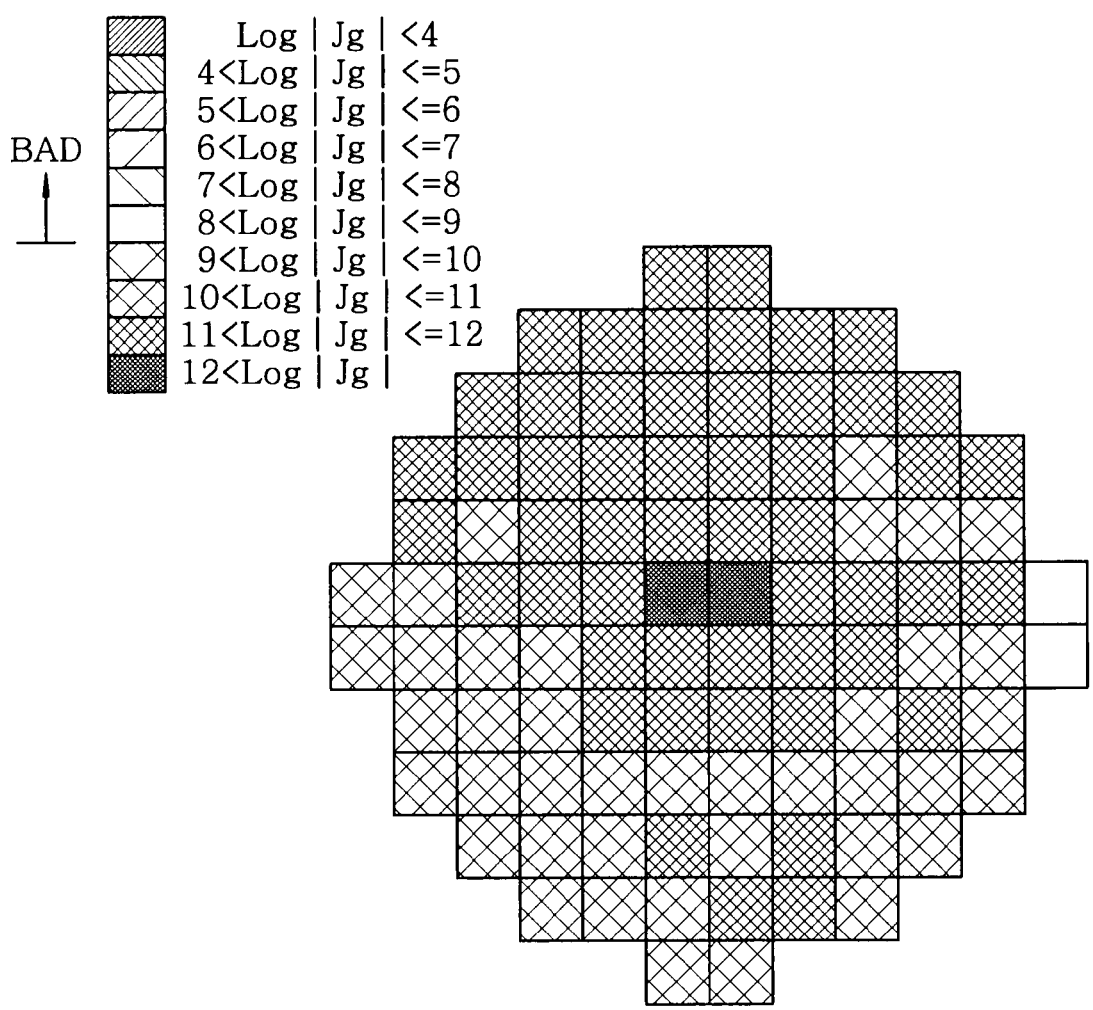
FIG. 14 is a Jg map of the silicon nitride film having a tensile stress.
Figure 15:
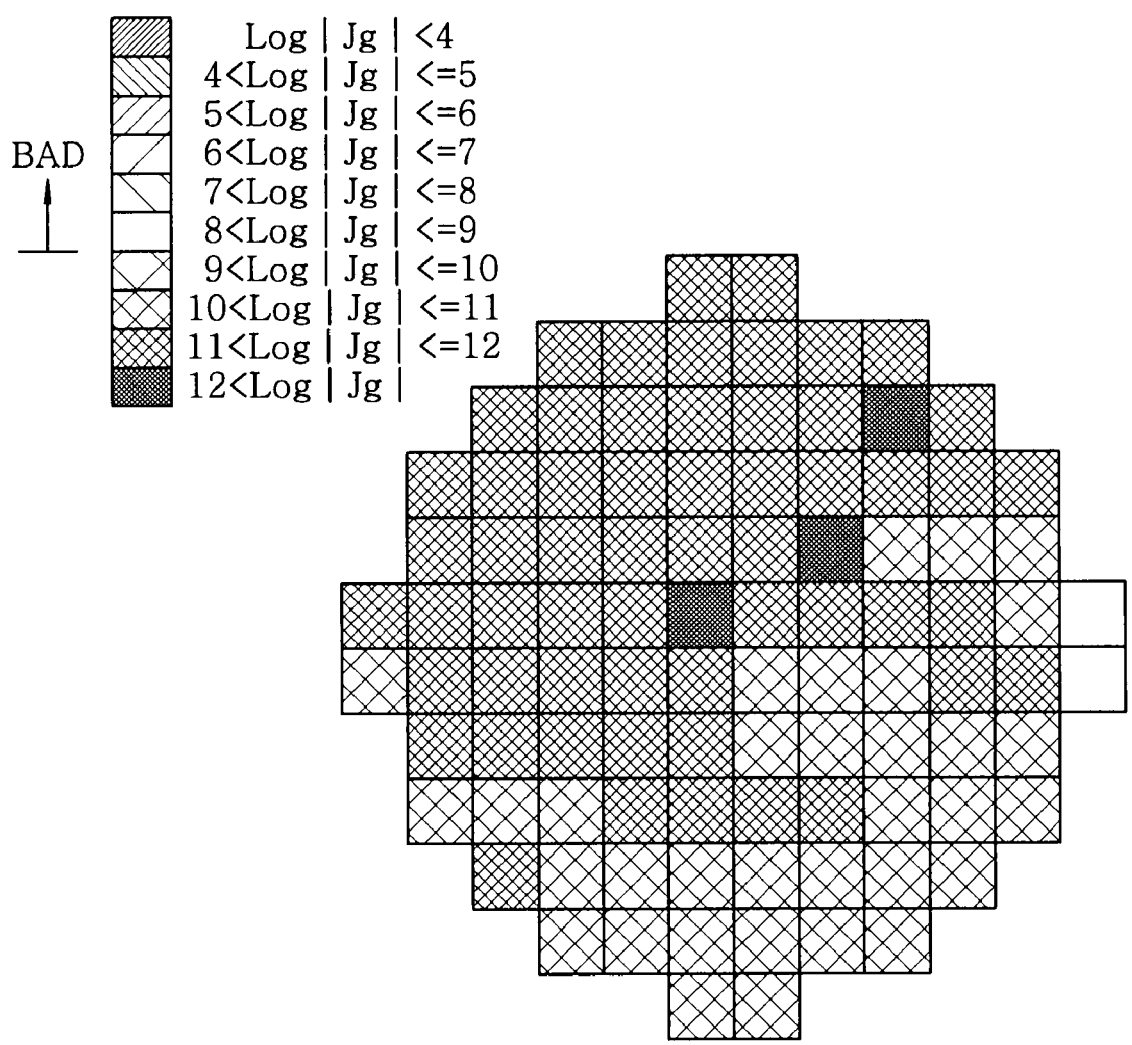
FIG. 15 is a Jg map of the silicon nitride film having a compressive stress.

FIG. 14 is a Jg map showing charge-up damage when a silicon nitride film having a tensile stress is formed on the test wafer. FIG. 15 is a Jg map showing charge-up damage when a silicon nitride film having a compressive stress is formed on the test wafer. FIGS. 14 and 15 are measurement results in the MOS capacitors having an AAR of 1,000,000.

As shown in FIGS. 14 and 15, the Jg value is sufficiently smaller than $1\times10^{-9}[A/\mu m^2]$ even at an AAR of 1,000,000 at which leakage easily occurs. Although not shown in the drawings, the Jg values were far smaller at other AARs. As described above, it was checked that plasma damage hardly occurs when a silicon nitride film having a stress is formed by using the plasma processing apparatus 100.

(2) Step Coverage Evaluation

A silicon nitride film having a tensile stress was formed on a test Si substrate having a trench by using the plasma processing apparatus 100 under plasma CVD conditions in which a $NH_3$ gas flow rate is set to be 500 mL/min (sccm); a $Si_2H_6$ gas flow rate, 5 mL/min (sccm); a process pressure, 133.3 Pa (1 Torr); a temperature of the mounting table 2, 500° C.; and microwave power, 2000 W. The trench has an aspect ratio (depth/width) of 1/1.

Film thicknesses of a top portion (flat portion around the trench), a side portion (sidewall of the trench) and a bottom portion (bottom portion of the trench) of the silicon nitride film were measured to evaluate step coverage. A film thickness ratio of the side portion to the top portion (film thickness of the side portion/film thickness of the top portion×100) is 91%, and a film thickness ratio of the bottom portion to the top portion (film thickness of the bottom portion/film thickness of the top portion×100) is 97%, thereby obtaining good step coverage.

(3) Thermal Resistance Evaluation

Silicon nitride films having tensile and compressive stresses were formed by using the plasma processing apparatus 100 and annealed to investigate an effect of heat treatment on the stresses of the silicon nitride films. The film formation and annealing conditions are as follows.

Figure 16A:
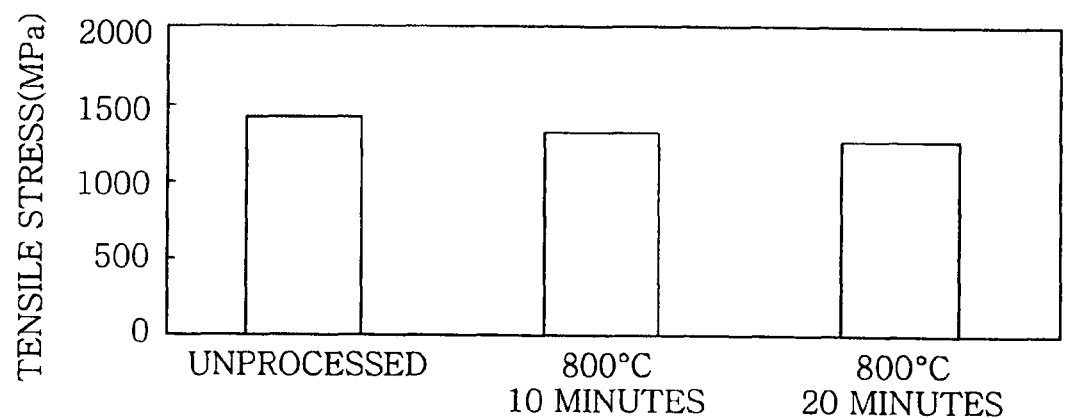
FIG. 16A is a graph showing the relationship between the stress of the silicon nitride film and annealing time in a case of tensile stress.
Figure 16B:
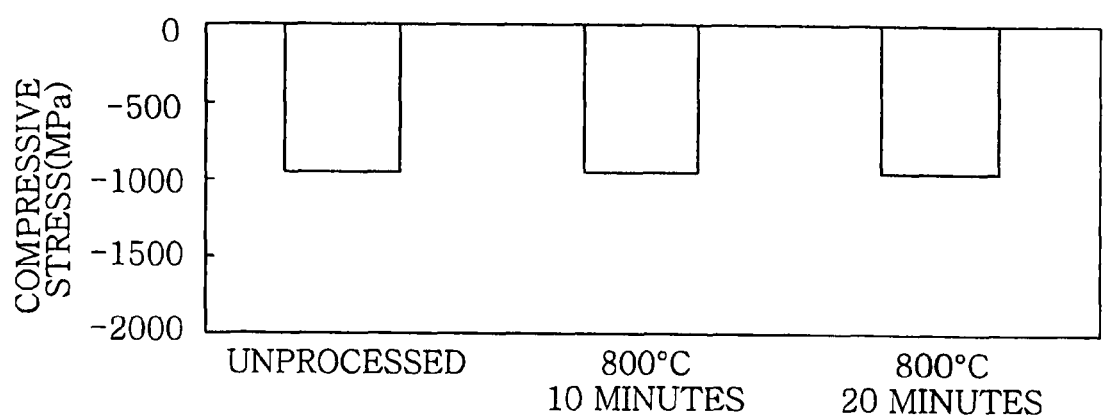
FIG. 16B is a graph showing the relationship between the stress of the silicon nitride film and annealing time in a case of compressive stress.

<Plasma CVD Conditions ($NH_3/Si_2H_6$ Gas Atmosphere)>
$NH_3$ gas flow rate: 400 mL/min (sccm)
$Si_2H_6$ gas flow rate: 5 mL/min (sccm)
Process pressure: 133.3 Pa (1000 mTorr)
Temperature of mounting table 2: 500° C.
Microwave power: 2000 W
<Plasma CVD Conditions ($N_2/Si_2H_6$ Gas Atmosphere)>
$N_2$ gas flow rate (gas inlet 15a): 1100 mL/min (sccm)
$Si_2H_6$ gas flow rate: 1 mL/min (sccm)
$N_2$ gas flow rate (gas inlet 15b): 100 mL/min (sccm)
Process pressure: 2.6 Pa (20 mTorr)
Temperature of mounting table 2: 500° C.
Microwave power: 1000 W
<Annealing Conditions>
Process temperature: 800° C.
Process pressure: 101308 Pa (760 Torr)
Process time: 0 minutes (unprocessed), 10 minutes or 20 minutes FIGS. 16A and 16B are graphs showing the relationships between the stresses of the silicon nitride films and annealing time periods, wherein FIG. 16A shows a case of tensile stress and FIG. 16B shows a case of compressive stress. It can be seen from FIGS. 16A and 16B that the silicon nitride film having a tensile or compressive stress, formed under the above-described conditions by using $Si_2H_6$ and $N_2$ or $NH_3$ gases as source gases, exhibits very small variations in stress before and after annealing and has excellent thermal resistance. As a result, it was concluded that the silicon nitride film formed by using $Si_2H_6$ and $N_2$ or $NH_3$ gases as source gases has excellent thermal resistance in heat treatments repeated in the manufacture of various semiconductor devices.

The present invention is not limited to the above-described embodiments and various changes and modifications may be made without departing from the scope of the invention.

For instance, although the silicon nitride film having a high tensile or compressive stress is used as a coating film of the transistor so as to improve driving characteristics of the transistor, the present invention may be applied to the manufacture of various semiconductor devices capable of improving device characteristics by use of the stress without being limited thereto.

What is claimed is:

1. A method for forming a silicon nitride film having a high stress by using a plasma CVD method, comprising:
    loading a substrate to be processed in a processing chamber;
    introducing a nitrogen gas and a silicon-containing gas into the processing chamber;
    introducing microwaves into the processing chamber through a planar antenna having slots to generate a plasma of the nitrogen gas and the silicon-containing gas; and
    forming a silicon nitride film having a high compressive stress on the substrate by using the plasma CVD method,
    wherein the silicon nitride film is formed to have a compressive stress larger than 800 MPa at a process pressure of 1.3 Pa to 5.3 Pa and a process temperature of 300° C. to 800° C. in the processing chamber,
    wherein the strength of the compressive stress is controlled by changing the process pressure,
    wherein active nitrogen species in the plasma are originated only from the nitrogen gas, and
    wherein the high compressive stress of the silicon nitride film is maintained without a substantial change even when the silicon nitride film is annealed.

2. The method of claim 1, wherein silicon nitride film is formed at a process pressure of 1.3 Pa to 4 Pa to have a compressive stress of 1000 MPa or more.

3. The method of claim 1, wherein the silicon-containing gas is disilane ($Si_2H_6$).

4. A method of manufacturing a CMOS transistor, comprising the film forming method of claim 1.

5. The method of claim 1, wherein the high compressive stress of the silicon nitride film is maintained within 200 MPa of the 800 MPa even when the silicon nitride film is annealed.

6. A method for forming a silicon nitride film having a high stress by using a plasma CVD method, comprising:
    loading a substrate to be processed in a processing chamber;
    introducing an ammonia gas and a silicon-containing gas into the processing chamber;
    generating a plasma of the ammonia gas and the silicon-containing gas; and
    forming a silicon nitride film having a high tensile stress on the substrate by using the plasma CVD method,
    wherein the silicon nitride film is formed to have a tensile stress of 400 MPa or more at a process pressure of 6.7 Pa or more and a process temperature of 300° C. to 800° C. in the processing chamber,
    wherein the strength of the tensile stress is controlled by changing the process pressure,
    wherein active nitrogen species in the plasma are originated only from the ammonia gas, and
    wherein the high tensile stress of the silicon nitride film is maintained without a substantial change even when the silicon nitride film is annealed.

7. The method of claim 6, wherein the silicon nitride film is formed at a process pressure of 40 Pa to 266.6 Pa to have a tensile stress of 800 MPa to 2000 MPa.

8. The method of claim 6, wherein the silicon nitride film is formed at a process pressure of 133.3 Pa to 266.6 Pa to have a tensile stress of 1500 MPa to 2000 MPa.

9. The method of claim 6, wherein the silicon-containing gas is disilane ($Si_2H_6$).

10. A method of manufacturing a CMOS transistor, comprising the film forming method of claim 6.

11. The method of claim 6, wherein the high tensile stress of the silicon nitride film is maintained within 100 MPa of the 400 MPa even when the silicon nitride film is annealed.

12. A plasma CVD apparatus for forming a silicon nitride film having a high stress, comprising:
- a processing chamber in which a substrate to be processed is loaded;
- a gas supply system for supplying a nitrogen gas and a silicon-containing gas into the processing chamber;
- a plasma generating unit for generating a plasma of the nitrogen gas and the silicon-containing gas in the processing chamber;
- a gas exhaust unit for exhausting an inside of the processing chamber; and
- a controller for controlling the plasma CVD apparatus to form the silicon nitride film having a compressive stress larger than 800 MPa on the substrate by using a plasma CVD method by introducing the nitrogen gas and the silicon-containing gas from the gas supply system into the processing chamber and generating a plasma of the nitrogen gas and the silicon-containing gas in the processing chamber by the plasma generating unit at a process pressure smaller than 5.3 Pa and a process temperature of 300° C. to 800° C. in the processing chamber,
- wherein the strength of the compressive stress is controlled by changing the process pressure,
- wherein active nitrogen species in the plasma are originated only from the nitrogen gas, and
- wherein the compressive stress of the silicon nitride film is maintained without a substantial change even when the silicon nitride film is annealed.

13. The method of claim 9, wherein a flow rate ratio of $Si_2H_6/NH_3$ is 0.01 or less.

14. The apparatus of claim 12, wherein the compressive stress of the silicon nitride film is maintained within 200 MPa of the 800 MPa even when the silicon nitride film is annealed.

* * * * *